(12) United States Patent
Kamata et al.

(10) Patent No.: US 12,237,157 B2
(45) Date of Patent: Feb. 25, 2025

(54) PLASMA MEASUREMENT METHOD

(71) Applicant: Tokyo Electron Limited, Tokyo (JP)

(72) Inventors: Eiki Kamata, Yamanashi (JP); Mikio Sato, Yamanashi (JP); Taro Ikeda, Yamanashi (JP); Mitsutoshi Ashida, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 168 days.

(21) Appl. No.: 17/893,621

(22) Filed: Aug. 23, 2022

(65) Prior Publication Data

US 2023/0066120 A1    Mar. 2, 2023

(30) Foreign Application Priority Data

Sep. 1, 2021 (JP) ................................ 2021-142215

(51) Int. Cl.
   *H01J 37/32*     (2006.01)
(52) U.S. Cl.
   CPC .. *H01J 37/32935* (2013.01); *H01J 37/32146* (2013.01); *H01J 37/32926* (2013.01)
(58) Field of Classification Search
   CPC ........... H01J 37/32935; H01J 37/32146; H01J 37/32926; H05H 1/0062
   See application file for complete search history.

(56) References Cited

U.S. PATENT DOCUMENTS

| | | | | |
|---|---|---|---|---|
| 5,968,377 A | * | 10/1999 | Yuasa ............... | H01J 37/32027 204/192.12 |
| 2009/0068769 A1 | * | 3/2009 | Okumura .............. | H01J 37/321 257/E21.531 |
| 2009/0105980 A1 | * | 4/2009 | Tetsuka ............. | H01J 37/32082 118/712 |
| 2009/0151871 A1 | * | 6/2009 | Pease ................... | H05H 1/0081 156/345.28 |
| 2009/0295509 A1 | * | 12/2009 | Master ..................... | H01P 7/06 333/219.1 |

(Continued)

FOREIGN PATENT DOCUMENTS

| | | | | |
|---|---|---|---|---|
| DE | 102017212974 A1 | * | 1/2019 | ............ A61M 5/349 |
| JP | 2005290432 A | * | 10/2005 | |

(Continued)

*Primary Examiner* — Abdullah A Riyami
*Assistant Examiner* — Syed M Kaiser
(74) *Attorney, Agent, or Firm* — Fenwick & West LLP

(57) ABSTRACT

Measuring a plasma state using a probe device in the case of performing plasma processing on a substrate by introducing process gas into a processing container accommodating the substrate and by producing pulsed plasma using an electromagnetic wave pulse obtained by processing an electromagnetic wave generated from an electromagnetic wave oscillator using a pulsing device. An AC voltage to the pulsed plasma is applied via the probe device; transmitting a signal from the pulsed plasma based on the AC voltage via the probe device and measuring data including a current value; and obtaining a state of the pulsed plasma by analyzing the measured data. The frequency of the AC voltage deviates from a frequency of the electromagnetic wave pulse so that the number of data required for the measurement of the pulsed plasma within one cycle of the electromagnetic wave pulse is obtained within allowable time.

19 Claims, 22 Drawing Sheets

(56) References Cited

U.S. PATENT DOCUMENTS

| | | | |
|---|---|---|---|
| 2015/0007940 A1* | 1/2015 | Kaneko | H01J 37/32201 |
| | | | 118/723 AN |
| 2020/0176234 A1* | 6/2020 | Abraham | C23C 14/345 |
| 2022/0059326 A1* | 2/2022 | Jiang | H01J 37/32871 |

FOREIGN PATENT DOCUMENTS

| | | | | |
|---|---|---|---|---|
| JP | 2019046787 A | 3/2019 | | |
| JP | 2021503700 A | 2/2021 | | |
| WO | WO 2019/099870 A1 | 5/2019 | | |
| WO | WO-2019089268 A1 * | 5/2019 | | B01L 3/502792 |

\* cited by examiner

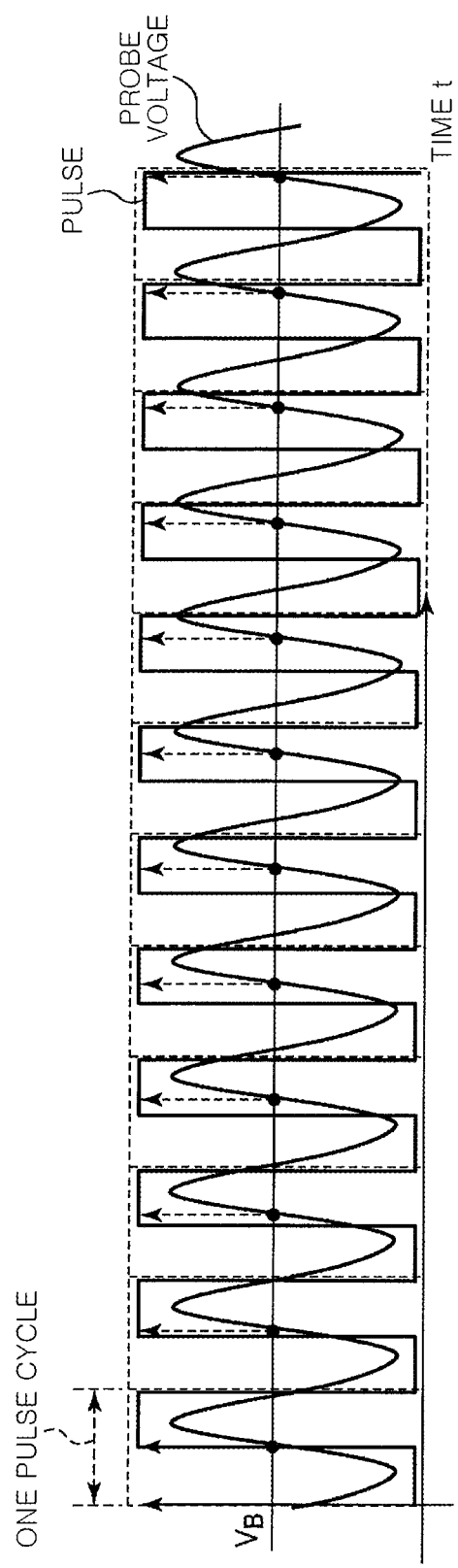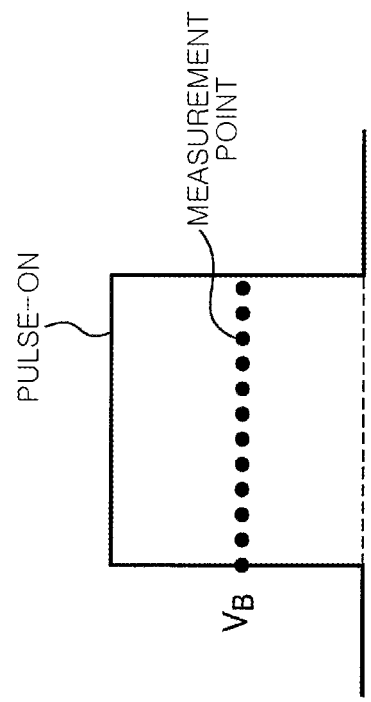

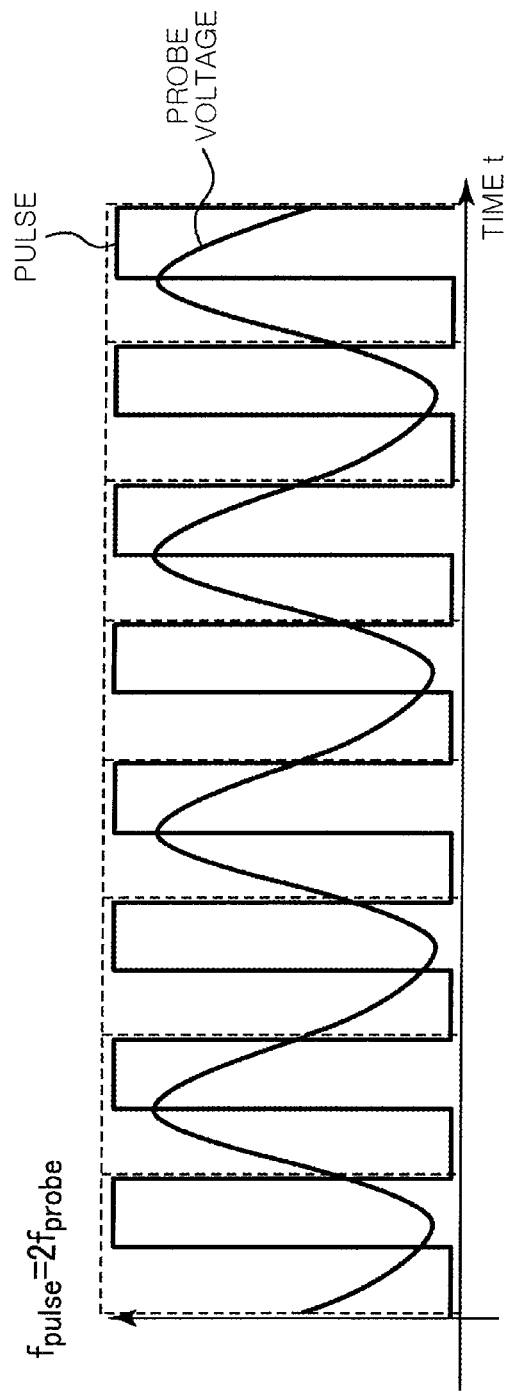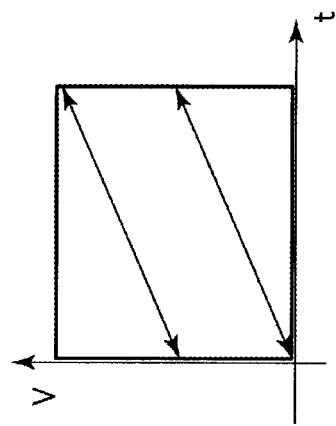

PLASMA MEASUREMENT METHOD

CROSS-REFERENCE TO RELATED APPLICATIONS

This application claims priority to Japanese Patent Application No. 2021-142215 filed on Sep. 1, 2021, the entire contents of which are incorporated herein by reference.

TECHNICAL FIELD

The present disclosure relates to a plasma measurement method.

BACKGROUND

Conventionally, a probe for measuring a plasma state is inserted into a chamber, and a measurement signal is supplied into the chamber from a measurement power supply to measure the plasma state. A DC probe (Langmuir probe) that measures plasma by applying a DC voltage is generally used as the probe. However, in plasma produced from process gas (process plasma), a deposition film is adhered to a probe surface, making plasma measurement difficult. On the other hand, Japanese Laid-open Patent Publication No. 2019-46787 proposes, as a probe capable of measuring plasma even in process plasma that causes a deposition film to be adhered, an AC probe that is covered with an insulating film and that measures plasma by applying an AC voltage.

On the other hand, Japanese Laid-open Patent Publication No. 2021-503700 discloses that pulsed plasma can reduce an average energy applied to a wafer and suppress an increase in an electron temperature in plasma.

SUMMARY

The present disclosure provides a plasma measurement method capable of measuring a state of pulsed plasma produced from process gas in real-time.

In accordance with an aspect of the present disclosure, there is provided a plasma measurement method for measuring a plasma state using a probe device in the case of performing plasma processing on a substrate by introducing process gas into a processing container accommodating the substrate and by producing pulsed plasma using an electromagnetic wave pulse, wherein the electromagnetic wave pulse is obtained by processing an electromagnetic wave generated from an electromagnetic wave oscillator using a pulsing device. The method comprises applying an AC voltage to the pulsed plasma via the probe device; transmitting a signal from the pulsed plasma based on the AC voltage via the probe device and measuring data including a current value; and obtaining a state of the pulsed plasma by analyzing the measured data. A frequency of the AC voltage is deviated from a frequency of the electromagnetic wave pulse so that the number of data required for the measurement of the pulsed plasma within one cycle of the electromagnetic wave pulse is obtained within allowable time.

BRIEF DESCRIPTION OF THE DRAWINGS

The objects and features of the present disclosure will become apparent from the following description of embodiments, given in conjunction with the accompanying drawings, in which:

FIGS. 9A and 9B explain the plasma measurement method according to the embodiment;

FIGS. 12A and 12B show a relationship between an electromagnetic wave pulse and an AC voltage in the case where a condition $f_{pulse}=2f_{probe}$ is satisfied and data obtained at that time;

DETAILED DESCRIPTION

Hereinafter, embodiments will be described in detail with reference to the accompanying drawings.

<Plasma Processing Apparatus to which Plasma Measurement Method is Applied>

Figure 1:
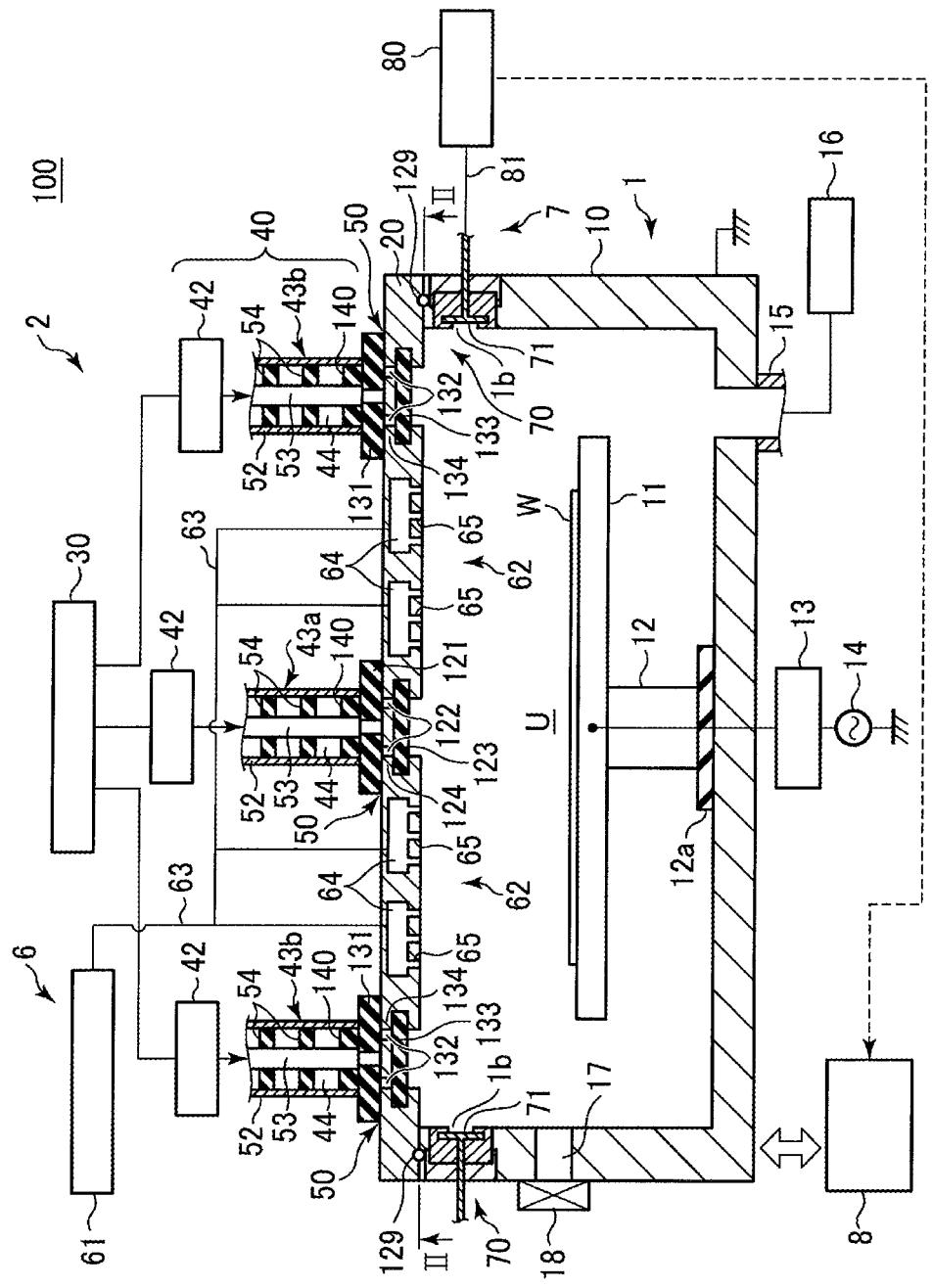
FIG. 1 is a cross-sectional view showing an example of a plasma processing apparatus to which a plasma measurement method according to an embodiment is applied.

FIG. 1 is a cross-sectional view showing an example of a plasma processing apparatus to which a plasma measurement method according to an embodiment is applied.

A plasma processing apparatus 100 is configured as a plasma processing apparatus for performing plasma processing by radiating electromagnetic waves such as microwaves or the like.

The plasma processing apparatus 100 includes a processing container (chamber) 1 accommodating a semiconductor wafer W (hereinafter, simply referred to as "a wafer W") as a substrate. The plasma processing apparatus 100 performs plasma processing on the wafer W using surface wave plasma produced near an inner wall surface of a top wall portion in the processing container 1 by the electromagnetic waves radiated in the processing container 1. The plasma processing may be film formation, etching, ashing, or the like. Further, the substrate is not limited to a wafer, and may be another substrate such as an FPD substrate, a ceramic substrate, or the like.

The plasma processing apparatus 100 includes a plasma source 2, a gas supply mechanism 6, a probe unit 7, and a controller 8, in addition to the processing container 1.

The processing container 1 has a substantially cylindrical container body 10 having an upper opening and a top wall portion 20 that closes the upper opening of the container main body 10. The process container 1 has a plasma processing space therein. The container body 10 is made of a metal material such as aluminum, stainless steel, or the like, and is grounded. The top wall portion 20 is made of a metal material such as aluminum, stainless steel, or the like, and has a disc shape. A seal ring 129 is disposed on a contact surface between the container body 10 and the top wall portion 20 to airtightly seal the inside of the processing container 1.

A substrate support 11 on which the wafer W is placed is disposed in the processing container 1. The substrate support 11 is supported by a cylindrical support member 12 standing upright from a bottom central portion of the processing container 1 via an insulating member 12a. The substrate support 11 and the support member 12 may be made of a metal such as aluminum having an alumite-treated (anodically oxidized) surface or an insulating member (ceramic or the like) having therein an electrode for high frequency. The substrate support 11 may be provided with an electrostatic chuck for electrostatically attracting and holding the wafer W, a temperature control mechanism, a gas channel for supplying a heat transfer gas to a back surface of the wafer W, or the like.

A high-frequency bias power supply 14 is connected to the substrate support 11 through a matching device 13. By supplying a high-frequency power from the high-frequency bias power supply 14 to the substrate support 11, ions in the plasma are attracted to the wafer W. The high-frequency bias power supply 14 may not be provided depending on characteristics of plasma processing.

An exhaust line 15 is connected to the bottom portion of the processing container 1, and an exhaust device 16 including a vacuum pump is connected to the exhaust line 15. When the exhaust device 16 is operated, the inside of the processing container 1 is exhausted, whereby the inside of the processing container 1 is depressurized at a high speed to a predetermined degree of vacuum. A loading/unloading port 17 for loading/unloading the wafer W and a gate valve 18 for opening/closing the loading/unloading port 17 are disposed on a sidewall of the processing container 1.

The plasma source 2 generates electromagnetic waves and radiates the generated electromagnetic waves into the processing container 1 to produce plasma. The plasma source 2 includes an electromagnetic wave output unit 30, an electromagnetic wave transmission unit 40, and an electromagnetic wave radiation mechanism 50.

The electromagnetic wave output unit 30 has an electromagnetic wave oscillator for generating oscillated electromagnetic waves, a pulsing device for turning on and off the oscillated electromagnetic waves in a pulse shape, an amplifier for amplifying the oscillated electromagnetic waves, and a distributor for distributing the amplified electromagnetic waves to a plurality of parts. The electromagnetic wave pulse processed by the pulsing device is distributed to a plurality of parts and outputted. A frequency within a range from 30 kHz to a microwave band, i.e., from 30 kHz to 30 GHz, can be used as a frequency of the electromagnetic wave. A frequency within a range from 500 Hz to 100 kHz can be preferably used as the frequency of the electromagnetic wave pulse.

The electromagnetic wave pulse outputted from the electromagnetic wave output unit 30 is radiated into the processing container 1 through the electromagnetic wave transmission unit 40 and the electromagnetic wave radiation mechanism 50. Further, gas is supplied into the processing container 1 as described later, and the supplied gas is excited by the electric field of the introduced electromagnetic wave. As a result, surface wave plasma is produced.

Figure 2:
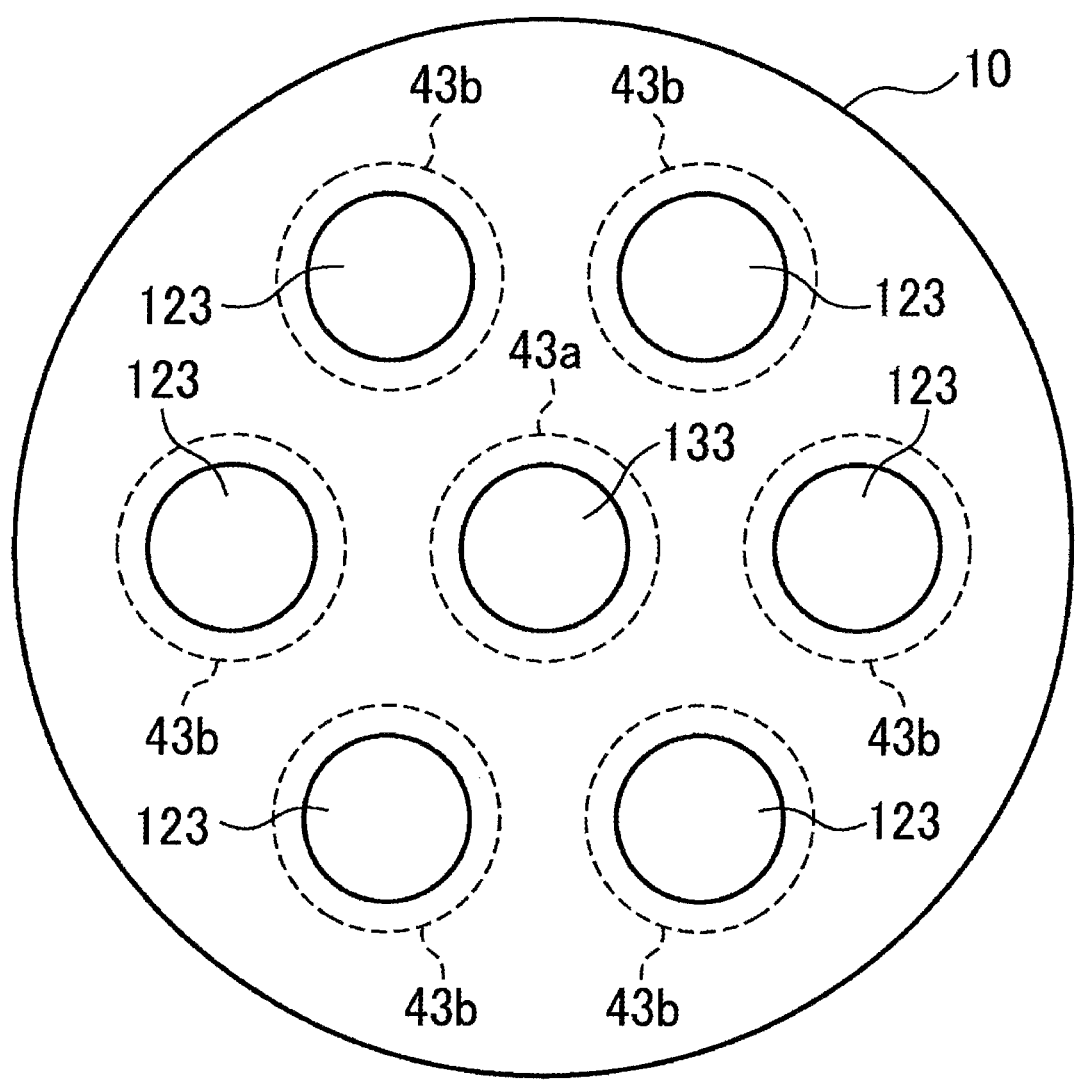
FIG. 2 is a bottom view showing an example of an inner wall state of a top wall portion of the plasma processing apparatus to which the plasma measurement method according to the embodiment is applied.

The electromagnetic wave transmission unit 40 transmits the electromagnetic wave pulse outputted from the electromagnetic wave output unit 30. The electromagnetic wave transmission unit 40 includes a plurality of amplifiers 42, as shown in FIG. 2 illustrating a cross-section taken along line II-II of FIG. 1, a central electromagnetic wave introducing portion 43a disposed at the center of the top wall portion 20, and six peripheral electromagnetic wave introducing portions 43b arranged at equal intervals at the peripheral portion of the top wall portion 20. The plurality of amplifiers 42 amplify the electromagnetic wave pulses distributed by the distributor of the electromagnetic wave output unit 30, and are disposed corresponding to the central electromagnetic wave introducing portion 43a and the six peripheral electromagnetic wave introducing portions 43b. The central electromagnetic wave introducing portion 43a and the six peripheral electromagnetic wave introducing portions 43b have a function of introducing the electromagnetic wave pulses outputted from the corresponding amplifier 42 into the electromagnetic wave radiation mechanism 50 and a function of matching an impedance.

The central electromagnetic wave introducing portion 43a and the peripheral electromagnetic wave introducing portions 43b are configured by coaxially arranging a cylindrical outer conductor 52 and a rod-shaped inner conductor 53 disposed at the center thereof. The gap between the outer conductor 52 and the inner conductor 53 serves as an electromagnetic wave transmission path 44 to which an electromagnetic wave power is supplied and through which the electromagnetic wave propagates toward the electromagnetic wave radiation mechanism 50.

The central electromagnetic wave introducing portion 43a and the peripheral electromagnetic wave introducing portions 43b are provided with a pair of slags 54 and an impedance adjusting member 140 located at the front end thereof. By moving the slags 54, the impedance of the load (plasma) in the processing container 1 is matched with the characteristic impedance of the electromagnetic wave power supply in the electromagnetic wave output unit 30. The impedance adjusting member 140 is made of a dielectric material, and is configured to adjust the impedance of the electromagnetic wave transmission line 44 by a relative permittivity thereof.

The electromagnetic wave radiation mechanism 50 includes wave retardation members 121 and 131, slot antennas 124 and 134 respectively having slots 122 and 132, and dielectric members 123 and 133. The wave retardation members 121 and 131 are disposed at position corresponding to the central electromagnetic wave introducing portion 43*a* on the upper surface of the top wall portion 20 and positions corresponding to the peripheral electromagnetic wave introducing portions 43*b* on the upper surface of the top wall portion 20, respectively. Further, the dielectric members 123 and 133 are disposed at position corresponding to the central electromagnetic wave introducing portion 43*a* and positions corresponding to the peripheral electromagnetic wave introducing portions 43*b* in the top wall portion 20, respectively. The slots 122 and 132 are disposed in a portion of the top wall portion 20 between the wave retardation member 121 and the dielectric member 123, and a portion of the top wall portion 20 between the wave retardation member 131 and the dielectric member 133, respectively. The portions where the slots are formed serve as the slot antennas 124 and 134.

Each of the wave retardation members 121 and 131 has a disc shape, and is arranged to surround the front end of the inner conductor 53. The wave retardation members 121 and 131 have a dielectric constant greater than that of a vacuum, and are made of, e.g., quartz, ceramic, a fluorine-based resin such as polytetrafluoroethylene or the like, or a polyimide-based resin. The wave retardation members 121 and 131 have a function of making the wavelength of the electromagnetic wave shorter than that in vacuum to make the antenna smaller. The wave retardation members 121 and 131 can adjust the phase of the electromagnetic wave by the thicknesses thereof. By adjusting the thicknesses of the wave retardation members 121 and 131 so that the slot antennas 124 and 134 become "the antinodes" of the standing wave, the reflection is minimized and the radiation energy of the slot antennas 124 and 134 is maximized.

Similarly to the wave retardation members 121 and 131, the dielectric members 123 and 133 are made of, e.g., quartz, ceramic such as alumina ($Al_2O_3$), a fluorine-based resins such as polytetrafluoroethylene or the like, or a polyimide-based resin. The dielectric members 123 and 133 are fitted in a space formed in the top wall portion 20, and openings are formed at portions corresponding to the dielectric members 123 and 133 on the bottom surface of the top wall portion 20. Therefore, the dielectric members 123 and 133 are exposed to the inside of the processing container 1, and function as dielectric windows for supplying electromagnetic wave pulses to a plasma generation space U.

The number of peripheral electromagnetic wave introducing portions 43*b* and the number of dielectric members 133 is not limited to six, and may be two or more and preferably three or more.

The gas supply mechanism 6 includes a gas supply source 61, a gas introducing portion 62 disposed at the top wall portion 20, and gas supply lines 63 for supplying gas from the gas supply source 61 to the gas introducing portions 62. The gas introducing portion 62 has a plurality of gas diffusion spaces 64 arranged in a ring shape at the top wall portion 20, and a plurality of gas injection holes 65 for injecting gas from the gas diffusion spaces 64 into the processing container 1. The gas supplied from the gas supply source 61 to the gas supply lines 63 reaches the gas diffusion spaces 64 of the gas introducing portion 62, and is supplied in a shower pattern into the processing container 1 through the gas injection holes 65. The gas may be gas for plasma generation such as Ar gas, or process gas used for processing. The gas supply mechanism 6 is not limited to the one that injects gas from the top wall portion 20 in a shower pattern as in this example.

The probe unit 7 includes probe devices (AC probe) 70 and a power supply/monitoring portion 80, and measures a state of pulsed plasma by applying an AC voltage to plasma via the probe devices 70. A plurality of probe devices 70 are arranged in a circumferential direction on the upper part of the sidewall of the processing container 1. A plurality of openings 1*b* are formed on the upper part of the sidewall of the processing container 1 in a state of being separated from each other corresponding to the portions where the probe devices 70 are attached. The openings 1*b* may be continuous to form one opening instead of being separated into the plurality of openings. The power supply/monitoring portion 80 includes an AC power supply having a variable frequency and a variable voltage, and a monitoring device. The power supply/monitoring portion 80 and the probe devices 70 are connected through a coaxial cable 81.

The probe device 70 applies an AC voltage outputted from the AC power supply to the plasma, and transmits a signal (electron current and/or ion current) from the plasma to the monitoring device of the power supply/monitoring portion 80.

Figure 3A:
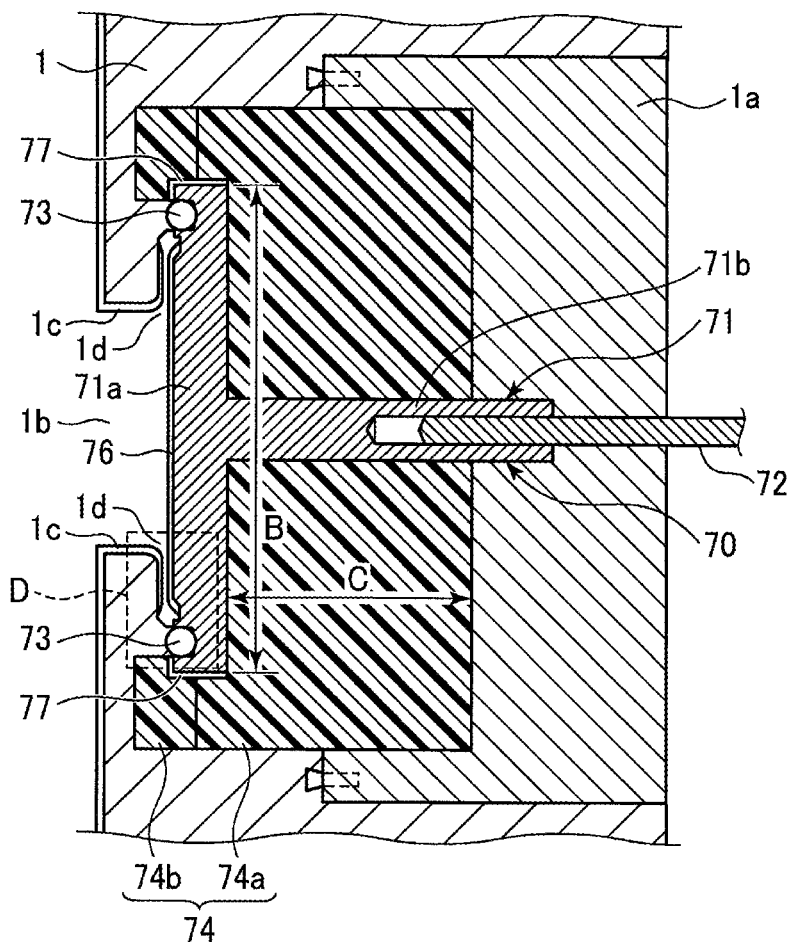
FIGS. 3A and 3B are cross-sectional views showing an example of a probe device used in the plasma processing apparatus to which the plasma measurement method according to the embodiment is applied.
Figure 3B:
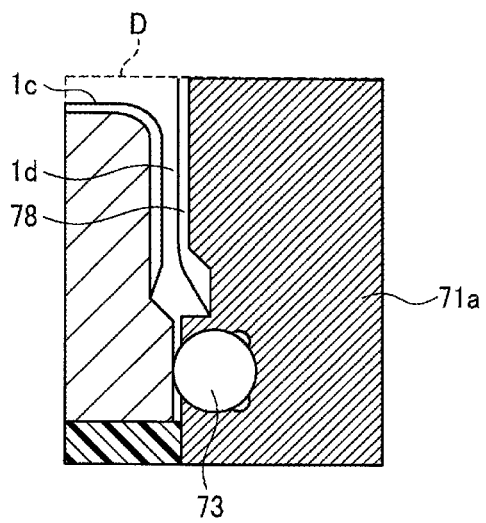

FIGS. 3A and 3B are cross-sectional views showing an example of the probe device 70. FIG. 3A is an overall view, and FIG. 3B is an enlarged cross-sectional view showing an area D surrounded by a dashed line. The probe device 70 includes an antenna portion 71 attached to the opening 1*b* formed in the sidewall of the processing container 1 via an O-ring 73, an electrode 72 connected to the antenna portion 71, and a dielectric support 74 that supports the antenna portion 71 from the surroundings. The antenna portion 71 has a plate-shaped member 71*a* on the front end side facing the opening 1*b* and a rod portion 71*b* extending rearward from the center of the back surface of the plate-shaped member 71*a*. The electrode 72 is connected to the rear end of the rod portion 71*b*. The coaxial cable 81 is connected to the electrode 72. The shape of the plate-shaped member 71*a* is not particularly limited, and may be, e.g., a disc shape or a rectangular shape.

The plate-shaped member 71*a* is disposed to close the back surface side of the opening 1*b* via the O-ring 73 made of a dielectric material such as resin or the like. The front end surface of the antenna portion 71 and the back surface near the opening 1*b* formed at the wall of the processing container 1 are separated to form a gap 1*d*. Since the gap 1*d* is formed between the front end surface of the antenna portion 71 and the wall of the processing container 1, the antenna portion 71 is connected to the wall of the processing container 1 in a DC manner, thereby preventing a current (stray current) from flowing through the wall of the processing container 1. However, if the gap 1*d* is too wide, gas or plasma enters the gap 1*d*, causing problems such as corrosion due to plasma, generation of particles due to gas intrusion, and abnormal discharge. Therefore, the gap 1*d* is set to a width that does not allow plasma or gas to enter.

The surface of the plate-shaped member 71*a* on the front end side of the antenna portion 71, which is inside the O-ring 73, is covered with the insulating film 76, and is insulated from the plasma in a DC manner. Further, an area of the wall surface of the processing container 1 from at least the side surface of the opening 1*b* through the back surface of the opening 1b to the O-ring 73 is covered with an insulating film 1c. The insulating film 76 and the insulating film 1c are formed by thermal spraying of ceramic such as $Y_2O_3$ or the like. The insulating films 76 and 1c may be formed by anodic oxidation of aluminum. By forming the insulating films 76 and 1c, a DC current can be prevented and the plasma resistance can be improved. The surface of the antenna portion 71 closer to the atmosphere than to the O-ring 73 and the inner wall surface of the processing container 1 are coated with the insulating film 77. Accordingly, the plasma resistance is further improved.

The surface of the antenna portion 71 on which the insulating film 76 is formed is exposed to the plasma generation space U side at a position recessed from the inner wall surface of the processing container 1 where the opening 1b is formed. Since the surface of the antenna portion 71 is recessed, the influence of the plasma on the probe device 70 is reduced, and the position of the gap 1d where particles are generated becomes distant from the wafer W, thereby reducing the influence of the particles. Further, since the surface of the antenna portion 71 is recessed without being positioned on the same plane as the inner wall surface of the processing container 1, it is possible to make it difficult to cause a mode jump of the surface wave plasma propagating on the inner wall surface of the processing container 1 and avoid an abnormal discharge.

The size of the opening 1b is determined by the balance between the sensitivity of the antenna portion 71 and the adverse effect on the antenna portion 71 due to the intrusion of plasma or gas. In other words, the larger the size of the opening 1b, the higher the sensitivity of the antenna portion 71, but since plasma or gas is more likely to enter the antenna portion 71 side, the antenna portion 71 is more likely to be corroded, which may deteriorate the performance of the probe device 70 or cause an abnormal discharge. Further, if the opening 1b is enlarged to increase the sensitivity of the probe device 70 too much, the measurement result may be easily affected by the adhesion of generated reaction products, and the measurement accuracy may be lowered. The shape of the opening 1b is not particularly limited, and may be an appropriate shape such as a circle, a rectangle, or the like.

The dielectric support 74 is made of a resin such as PTFE, and surrounds and supports the antenna portion 71. A fixing member 1a made of a metal such as aluminum or the like is attached to the back surface side of the dielectric support 74 to cover the dielectric support 74, and the fixing member 1a is screwed to the sidewall of the processing container 1. Accordingly, the antenna portion 71 in close contact with the vicinity of the opening 1b of the sidewall of the processing container 1 via the O-ring 73 and the dielectric support 74 are fixed. The dielectric support 74 is divided into a main body 74a and an annular member 74b disposed at an outer peripheral portion on the surface side of the plate-shaped member 71a of the antenna portion 71. However, the dielectric support 74 may have an integrated structure.

The ratio of a length C of the dielectric support 74 in the depth direction to a diameter B of the plate-shaped member 71a shown in FIG. 3A is preferably within a range of 0.44 to 0.54 from the viewpoint of improving the sensitivity of the probe device 70.

Although the plurality of probe devices 70 are provided in the above example, one probe device 70 may be provided. Further, although the probe devices 70 are disposed on the inner wall of the processing container 1 in the above example, they may be disposed at another position such as the outer peripheral portion of the substrate support 11 or the inner wall of the top wall portion 20.

The controller 8 controls the operation and processing of each component of the plasma processing apparatus 100, such as the gas supply of the gas supply mechanism 6, the frequency and output of the electromagnetic wave pulse of the plasma source 2, the exhaust by the exhaust device 16, the frequency and voltage of the AC power supply applied to the probe device 70, the calculation of signal from the monitoring device, and the like. The controller 8 is typically a computer, and includes a main controller, an input device, an output device, a display device, and a storage device. The main controller has a central processing unit (CPU), a random access memory (RAM), and a read only memory (ROM). The storage device has a computer-readable storage medium such as a hard disk, and is configured to record and read information required for the control. In the controller 8, the CPU controls the plasma processing apparatus 100 by executing a program such as a processing recipe stored in the ROM or the storage medium of the storage device while using the RAM as a work area.

<Processing Operation in Plasma Processing Apparatus>

Next, the operation in the plasma processing apparatus 100 configured as described above will be described.

First, the gate valve 18 is opened, and the wafer W held on a transfer arm (not shown) is loaded into the processing container 1 from the loading/unloading port 17 and placed on the substrate support 11. An empty transfer arm is retracted from the processing container 1, and the gate valve 18 is closed. Next, gas is introduced into the processing container 1 from the gas supply mechanism 6 and the processing container 1 is exhausted by the exhaust device 16 to adjust a pressure therein. Then, a plasma generating gas such as Ar gas or a processing gas is introduced to produce plasma. The processing gas may be introduced after introducing only the plasma generating gas and igniting the plasma.

In the case of producing plasma, gas is introduced into the processing container 1, and an electromagnetic wave pulse processed by a pulsing device is outputted in this example, instead of a continuous electromagnetic wave, from the electromagnetic wave output unit 30 of the plasma source 2. In this case, the electromagnetic wave pulse distributed and outputted from the electromagnetic wave output unit 30 is amplified by the amplifiers 42 of the electromagnetic wave transmission unit 40, and then transmitted to the central electromagnetic wave introducing portion 43a and the peripheral electromagnetic wave introducing portions 43b. Then, the electromagnetic wave pulse transmitted thereto is radiated into the processing container 1 through the wave retardation members 121 and 131 of the electromagnetic wave radiation mechanism 50, the slots 122 and 132 of the slot antennas 124 and 134, and the dielectric members 123 and 133 that are the electromagnetic wave transmission windows. In this case, the impedance is automatically matched by moving the slags 54, and the electromagnetic wave pulse is supplied in a state where there is substantially no power reflection. The radiated electromagnetic wave pulse propagates as a surface wave on the surface of the top wall portion 20. The gas is excited by the electric field of the electromagnetic wave pulse, and pulsed surface wave plasma is produced in the plasma generation space U directly under the top wall portion 20 in the processing container 1. The wafer W is subjected to plasma processing using the pulsed surface wave plasma.

Figure 4:
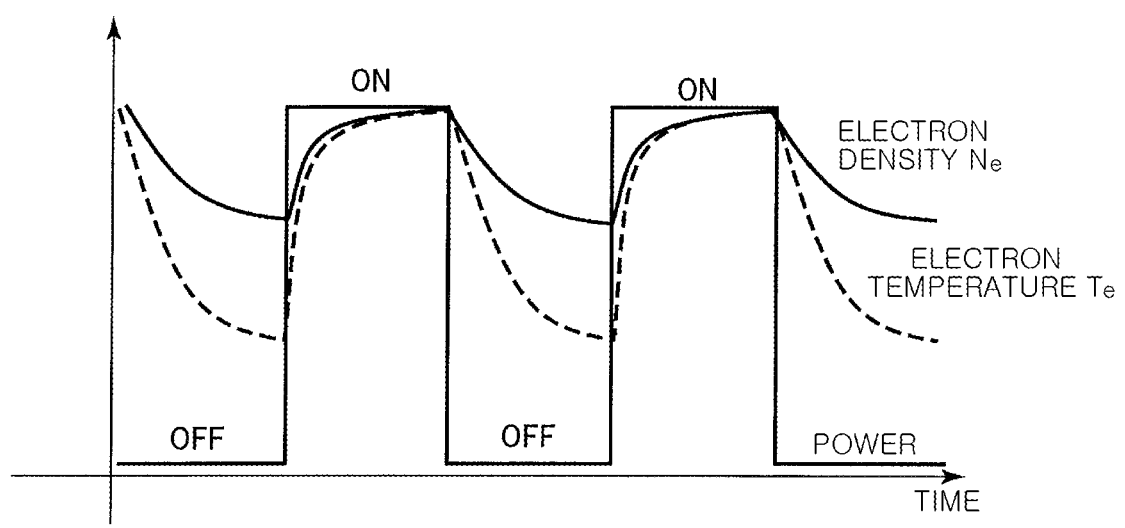
FIG. 4 shows behavior of an electron density and an electron temperature in an on state and an off state of a power of pulsed plasma.

The pulse frequency of the plasma is the same as the frequency of the pulsing device, and the plasma is switched on and off repeatedly at the same cycle as that of the pulsing device. In the pulsed plasma that is switched on and off repeatedly, when the plasma is switched off, the rate of decrease in electron temperature $T_e$ is higher than the rate of decrease in electron density Ne, as shown in FIG. 4. Therefore, the electron temperature $T_e$ can be lowered while ensuring a high electron density Ne as an average value. Accordingly, the wafer damage can be reduced due to the low electron temperature while maintaining a high processing rate due to the high electron density.

In the plasma processing apparatus 100 of the present embodiment, the wafer W is disposed in a region distant from the plasma generating region, and the plasma diffused from the plasma generating region is supplied to the wafer W, so that the plasma has essentially a low electron temperature and a high density. In addition, the effect of pulsed plasma is obtained, so that plasma processing with higher electron density and lower electron temperature is further realized.

During such plasma processing, the state of pulsed plasma is measured by applying an AC voltage to the plasma via the probe device (AC probe) 70 of the probe unit 7. At the time of measurement, the AC voltage from the AC power supply of the power supply/monitoring portion 80 is transmitted to the probe device 70 via the coaxial cable 81, and is applied from the probe device 70 to the plasma. Then, a signal from the plasma side is transmitted to the monitoring device of the power supply/monitoring portion 80 via the probe device 70, and data including a current value is measured. The measured data is transmitted from the monitoring device to the controller 8, and the data consisting of an electron current and an ion current is analyzed by the controller 8 to obtain the plasma state. For example, the controller 8 performs Fourier transform (FFT) of the data including the current value to calculate a plasma electron temperature and/or a plasma electron density as the plasma state.

The general measurement of the plasma state is performed as described above, but since the state of pulsed plasma fluctuates in a short time, a data measurement method is important in addition to the above-described procedure. Hereinafter, a method for measuring pulsed plasma will be described.

<Method for Measuring Pulsed Plasma>

Hereinafter, a method for measuring pulsed plasma will be described.

<Conventional Method for Measuring Pulsed Plasma>

First, a conventional method for measuring pulsed plasma will be described.

Figure 5A:
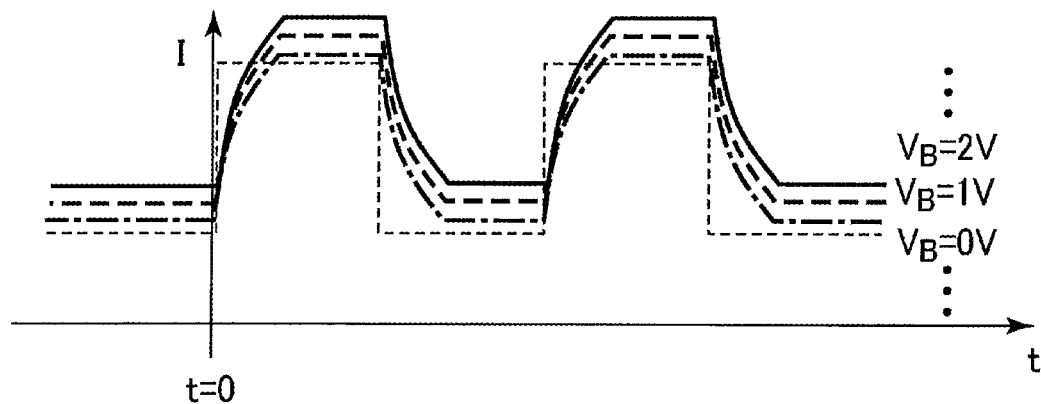
FIGS. 5A to 5C explain time-resolved measurement in the case of using a Langmuir probe.
Figure 5B:
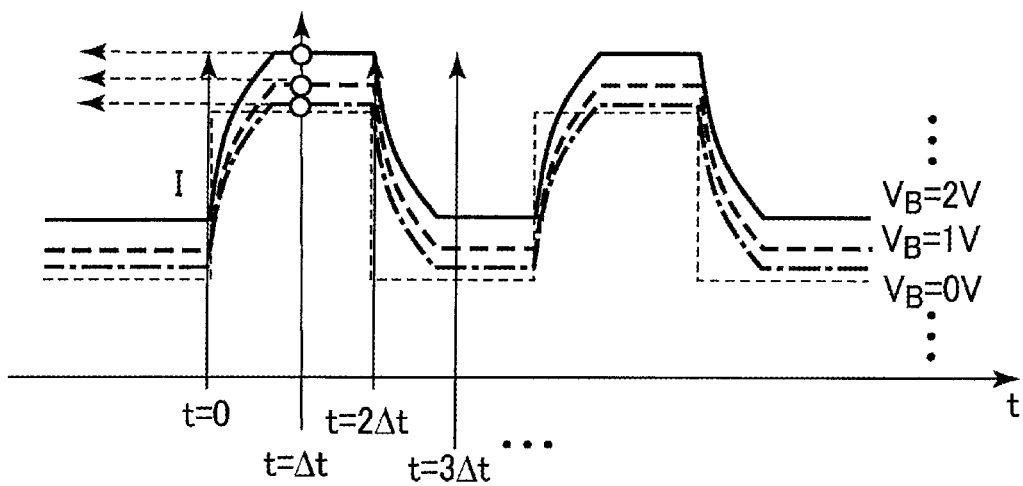
Figure 5C:
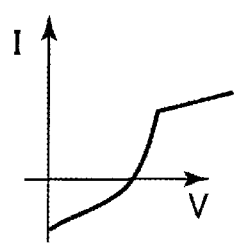
Figure 6:
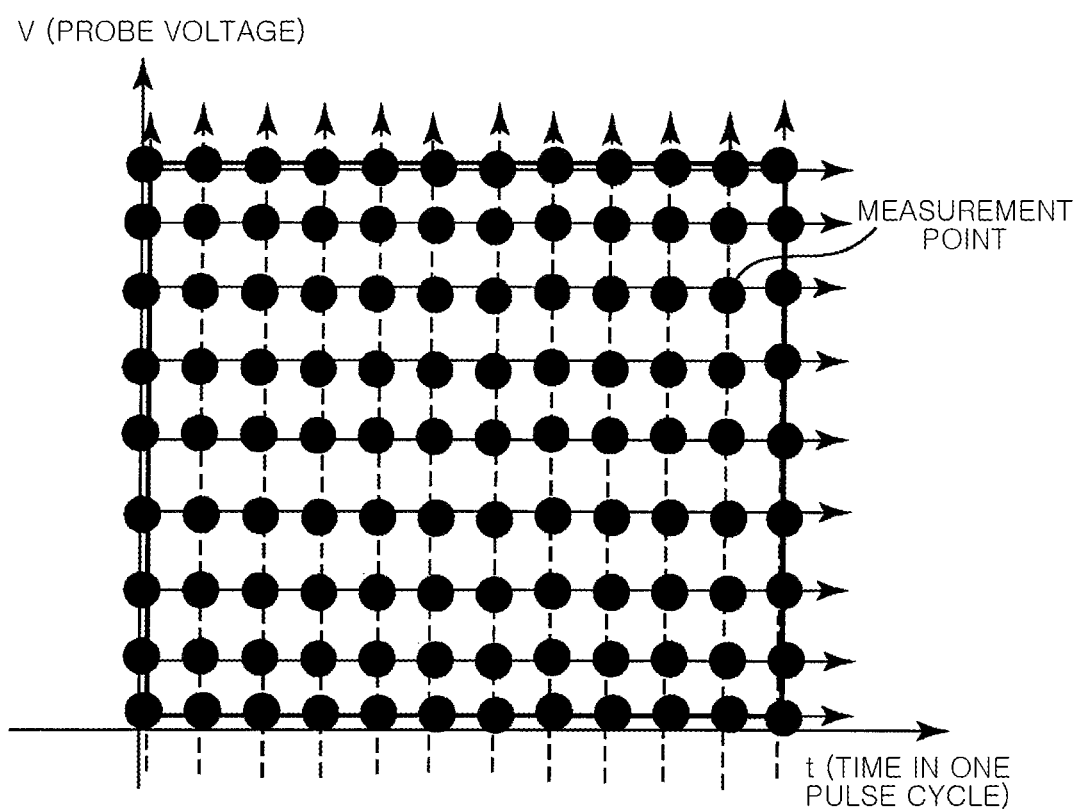
FIG. 6 explains data obtained by the time-resolved measurement in the case of using a Langmuir probe that is a DC probe.

As a method for measuring plasma, a method using a general Langmuir probe for measuring plasma by applying a DC voltage is used. The Langmuir probe can also be used for the measurement of pulsed plasma. However, the sweep speed of the probe voltage of the Langmuir probe is about 1 sec/10 V, and the peak width (on time) of the pulse is about 100 μs to 10 ms. Therefore, even if the plasma state is measured as it is, the characteristics at the time of pulse-on and the characteristics at the time of pulse-off are mixed, which makes it difficult to analyze it. Accordingly, time-resolved measurement shown in FIGS. 5A to 5C is performed. In other words, as shown in FIG. 5A, a probe voltage is set for a pulse waveform (dotted line), and a current waveform of plasma is measured with an oscilloscope repeatedly at a plurality of voltages. Then, as shown in FIG. 5B, the obtained waveforms are divided by time. Then, as shown in FIG. 5C, a graph of I-V characteristics is created for each time. In this case, as shown in FIG. 6, the measurement is performed by changing the applied voltage with respect to the time in one cycle of the pulse, as shown by vertical dashed arrows, measurement points are rearranged for each time to obtain a current value I (V, t) as a two-variable function with the voltage V and the time t as variables, and the analysis is performed.

The time-resolved measurement using a Langmuir probe is effective for basic evaluation. Since, however, a DC voltage is applied, when process gas is supplied and the plasma processing is performed, deposits are generated from the process plasma, and the current is disturbed by the deposits, which makes it difficult to apply the above time-resolved measurement. Further, it takes time because it is necessary to change the probe voltage little by little for the measurement. In addition, it is necessary to analyze the measurement results later, which makes real-time analysis impossible.

<General Time-Resolved Measurement Using AC Probe>

Hereinafter, a probe device that measures plasma by supplying an AC voltage, such as the probe device 70 of the present embodiment, is referred to as "AC probe." The AC probe applies an AC voltage, and thus can measure a plasma state by allowing current to flow even if deposits are adhered to the surface thereof, and can also be used for the process plasma. Further, the AC probe can perform real-time measurement. Japanese Laid-open Patent Publication No. 2019-46787 discloses that the process plasma state is measured in real-time in the case of performing plasma processing using an AC probe. However, Japanese Laid-open Patent Publication No. 2019-46787 does not disclose the measurement of the state of pulsed plasma.

Figure 7:
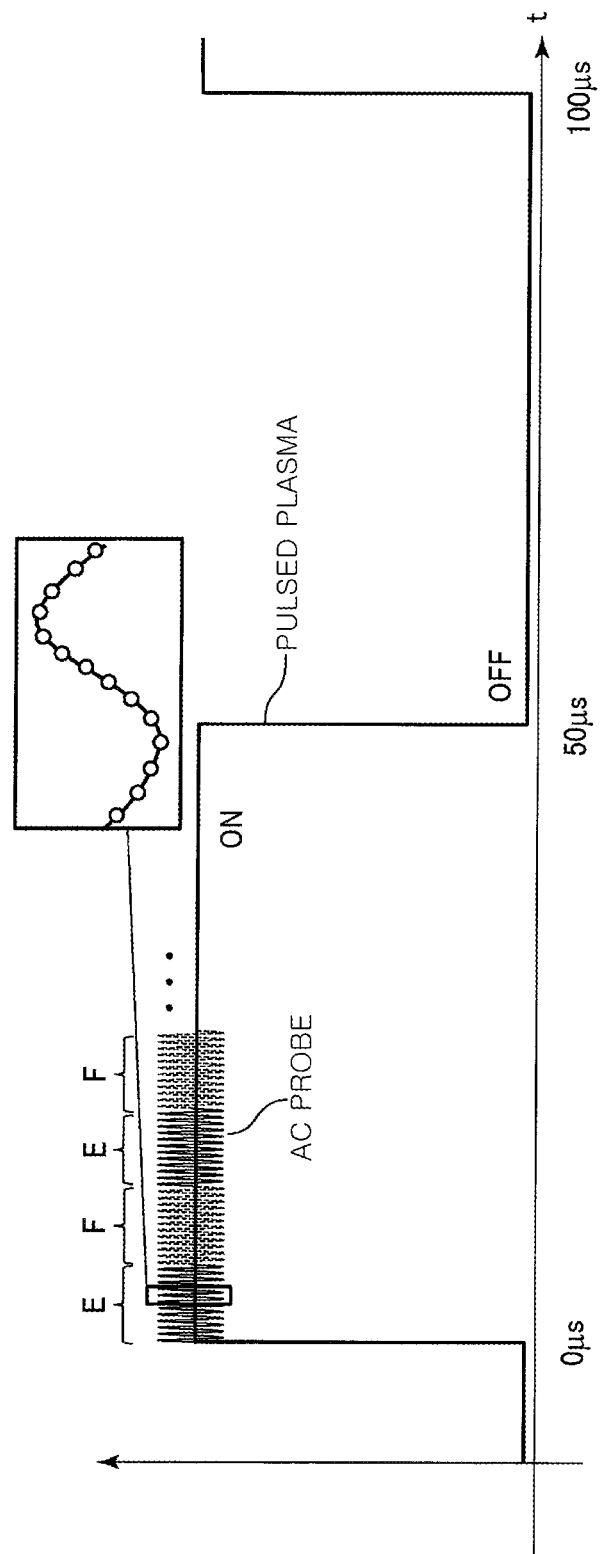
FIG. 7 explains general time-resolved measurement using an AC probe.
Figure 8:
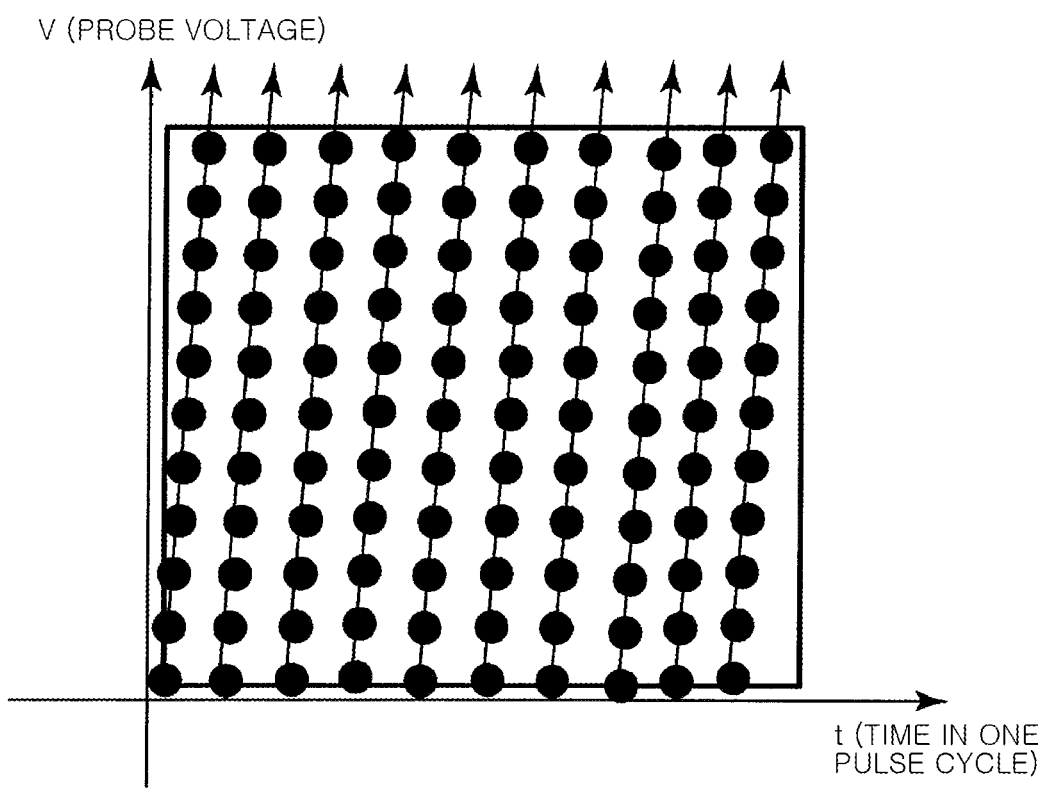
FIG. 8 explains data obtained by general time-resolved measurement using an AC probe.

In the case of measuring the pulsed process plasma state in real-time using an AC probe, if the general time resolved measurement is simply applied, the relationship between the frequency of the pulsed plasma and the AC frequency of the AC probe shown in FIG. 7 is obtained. In the case of measuring a current value, an AC voltage is applied with respect to the time in one cycle of the pulse to perform the measurement, and the current value data, typically the current value I (V, t) which is a two-variable function, is obtained and analyzed. In this case, the applied voltage is an AC voltage, so that the measurement lines indicated by arrows are inclined as shown in FIG. 8. The inclination of the measurement lines corresponds to the frequency of the AC voltage, and the larger the inclination, the higher the frequency. In the actual case, the width of V is smaller than that in the case where a DC voltage is applied.

In this case, as shown in FIG. 7, for example, when the frequency of the pulsed plasma is 10 kHz, in order to obtain sufficient measurement points by general time-resolved measurement, a frequency of 200 kHz to 1 MHz, which is higher by about 20 to 100 times, is required as the frequency of the AC voltage in the AC probe. As the frequency increases, it becomes difficult to handle, an increase in signals escaping to stray capacitance occurs, and the cost of the oscillator increases. Further, since the calculation using an AC probe is based on the premise that the plasma does not change in the signal, a sampling frequency of, for example, about 1 MHz, which is high enough to consider that the plasma does not change for about 1 to 10 cycles, is required. Further, signal processing needs to be performed in a very short time of 10 μs per processing. It is extremely difficult to perform data processing in a short time of 10 μs per processing after increasing the AC frequency to 200 kHz to 1 MHz.

<Plasma Measurement Method According to One Embodiment>

In one embodiment, the pulsed process plasma is measured by an AC probe.

However, the current value is measured by deviating the frequency of the AC voltage applied to the plasma from the frequency of the electromagnetic wave pulse processed by the pulsing device, instead of the above-described general time-resolved measurement.

Specifically, the pulsed plasma measurement is performed as follows.

The pulsed plasma measurement of the present embodiment is performed, as described above, by applying an AC voltage from the AC power supply of the power supply/monitoring portion 80 to the pulsed process plasma using the probe device 70, transmitting the signal from the process plasma based on the AC voltage using the probe device 70, measuring the data including the current value using the analyzer built in the monitoring device, and analyzing the measured data by the controller 8 to obtain the pulsed process plasma state.

In this case, by continuously applying an AC voltage having a frequency deviated from the pulse frequency from the AC power supply for a period of a plurality of pulses and superimposing data of different points of the plurality of pulses, it is possible to obtain data of the current value corresponding to the deviation of the cycle within the period of one cycle of the pulse, typically the current value I (V, t) which is a two-variable function. The number of data and the measurement time within the period of one cycle of the pulse at this time change depending on the "deviation" of the frequency of the probe voltage from the electromagnetic wave pulse frequency. Therefore, in the present embodiment, the frequency $f_{probe}$ of the probe voltage is deviated from the frequency $f_{pulse}$ of the electromagnetic wave pulse so that the number of data required for the measurement of the pulsed process plasma is obtained within allowable time within the period of one cycle of the plurality of pulses of pulsed plasma. Although FIG. 9A shows an example in which $f_{probe}$ made slightly lower than $f_{pulse}$, as shown in FIG. 9A, a plurality of data corresponding to the pulse-on period can be obtained during 12 pulse cycles. FIG. 9B shows measurement points of a voltage VB among the probe voltages. The data can also be obtained during the pulse-off period.

Figure 10:
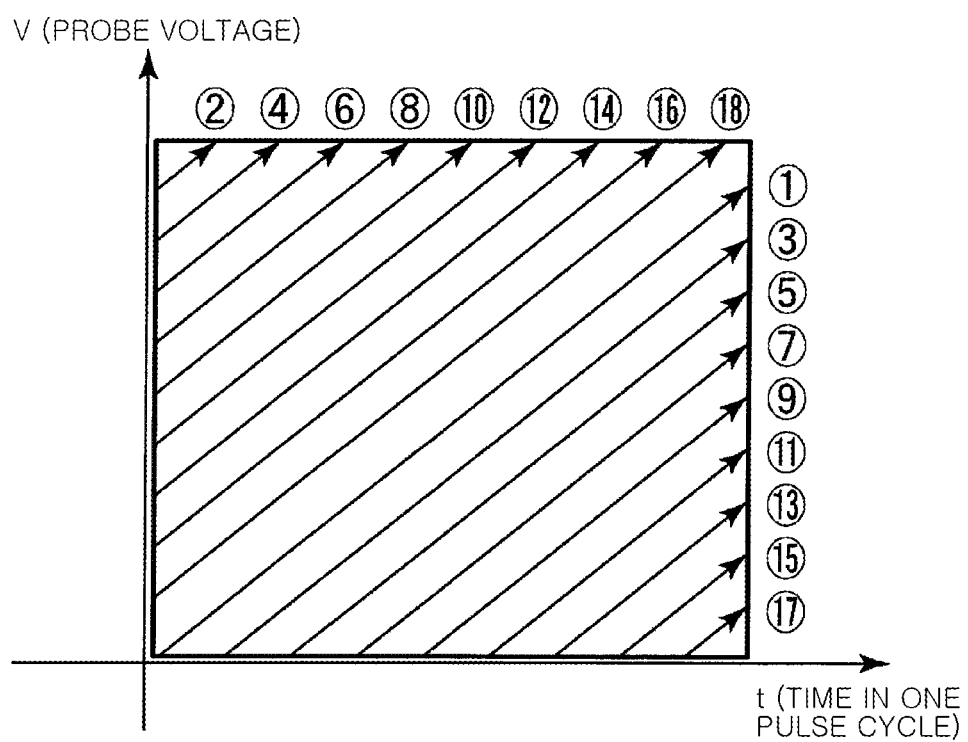
FIG. 10 shows data acquired by the plasma measurement method according to the embodiment.

The data acquisition at this time will be described with reference to FIG. 10. In FIG. 10, the horizontal axis represents time t in one pulse cycle, and the vertical axis represents a probe voltage (AC voltage) V. FIG. 10 shows the data of the acquired current value I (V, t) as a two-variable function. Circled numbers in FIG. 10 indicate the order of data acquisition. As shown in FIG. 10, when $f_{probe}$ made slightly lower than the $f_{pulse}$, it is possible to acquire data that fills the entire area (t-V area for one pulse cycle) to be measured, which is necessary for plasma measurement. The time required for the data measurement at this time can be calculated by about $1/(f_{pulse}-f_{probe})$, as will be described later. This is the same principal as "beat".

As described above, $f_{pulse}$ is preferably within a range of 500 Hz to 100 kHz, and $f_{probe}$ is preferably within a range of 500 Hz to 100 kHz. It is unnecessary that $f_{probe}$ is extremely higher than $f_{pulse}$ as in the above-described general time-resolved measurement using an AC probe, and $f_{probe}$ may be less than 10 times $f_{pulse}$.

Here, letting $f_{probe}$ have a frequency deviated from $f_{pulse}$ means that the ratio between $f_{probe}$ and $f_{pulse}$ is a simple integer ratio (1:1, 1:2, 2:3, or the like). For example, when $f_{pulse}$ is 10 kHz, $f_{probe}$ is 11 kHz. In this case, a t-V graph can be drawn at an interval of 1 kHz (=11 kHz-10 kHz). Further, when $f_{pulse}$ is 10 kHz, $f_{probe}$ may be 5.5 kHz while being deviated from a half thereof, i.e., 5 kHz (corresponding to the case of $f_{pulse}=2f_{probe}$) Further, when $f_{pulse}$ is 10 kHz, $f_{probe}$ may be 15.5 kHz while being deviated from 1.5 times thereof, i.e., 15 kHz (corresponding to the case of $2f_{pulse}=3f_{probe}$).

Figure 11A:
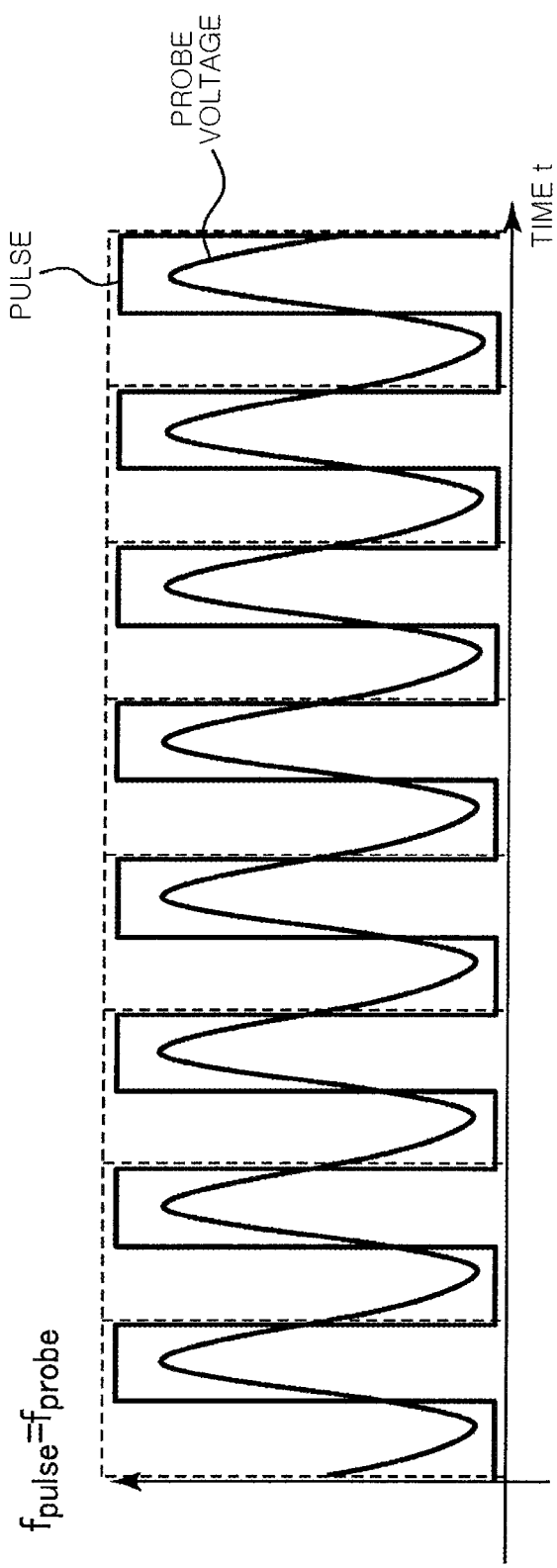
FIGS. 11A and 11B show a relationship between an electromagnetic wave pulse and an AC voltage in the case where a condition $f_{pulse}=f_{probe}$ is satisfied and data obtained at that time.
Figure 11B:
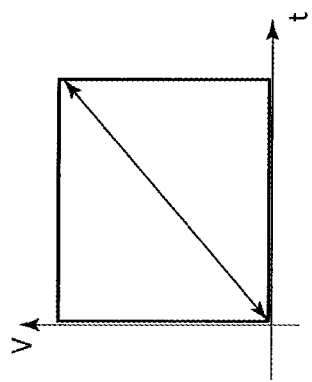
Figure 13A:
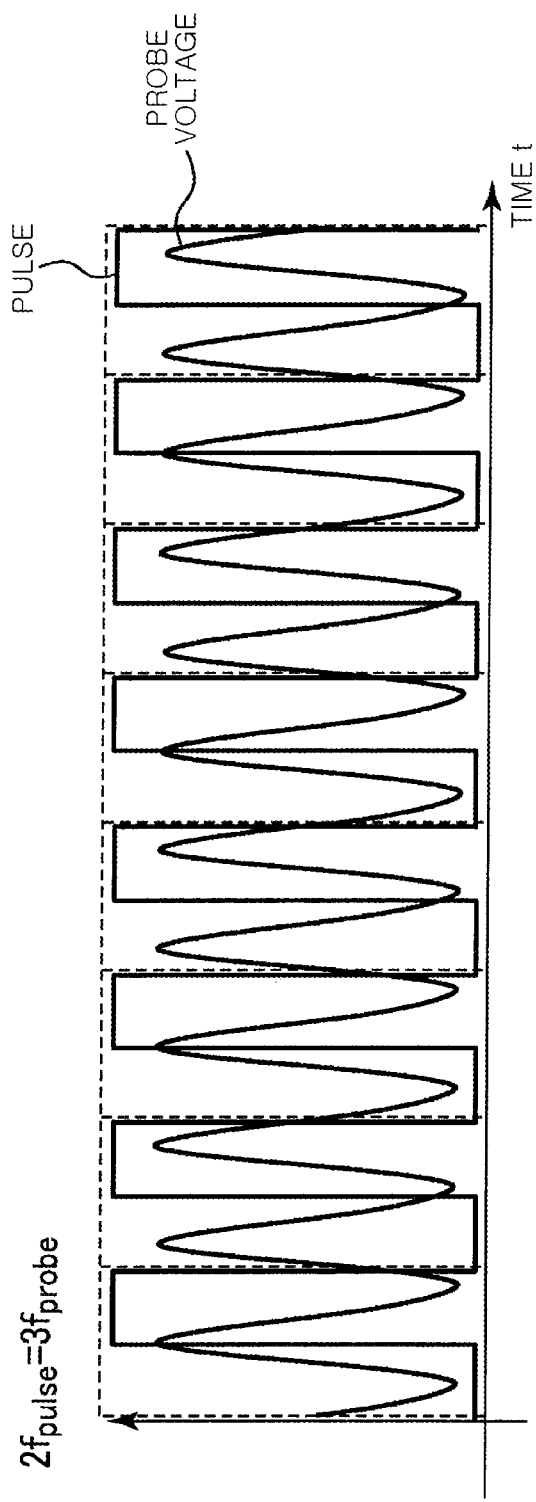
FIGS. 13A and 13B show a relationship between an electromagnetic wave pulse and an AC voltage in the case where a condition $2f_{pulse}=3f_{probe}$ is satisfied and data obtained at that time.
Figure 13B:
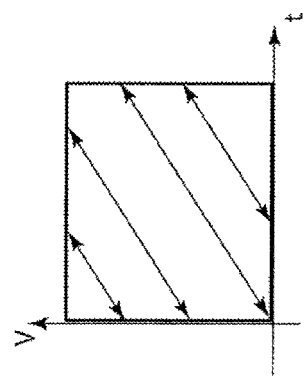

In the case of a simple integer ratio, e.g., in the case of $f_{pulse}=f_{probe}$, in the case of $f_{pulse}=2f_{probe}$, and in the case of $2f_{pulse}=3f_{probe}$, it becomes as shown in FIGS. 11A, 12A, and 13A, respectively, there is insufficient data in the pulse cycle, and the area (t-V area for one pulse cycle) to be measured cannot be filled with a satisfactory density as shown in FIGS. 11B, 12B, and 13B, so that the data necessary for accurately obtaining the plasma state cannot be acquired. For example, when the amount of deviation is small as in the case of $f_{pulse}=10$ kHz and $f_{probe}=10.0001$ kHz, the data acquisition interval becomes 0.0001 kHz (i.e., data acquisition once every 10 seconds), which lacks real-time performance, and it takes time to fill the area (t-V area for one pulse cycle) to be measured. However, it may take some time, and in such a case, such a small amount of deviation is acceptable. The measurement time is preferably 10 sec or less.

Figure 14:
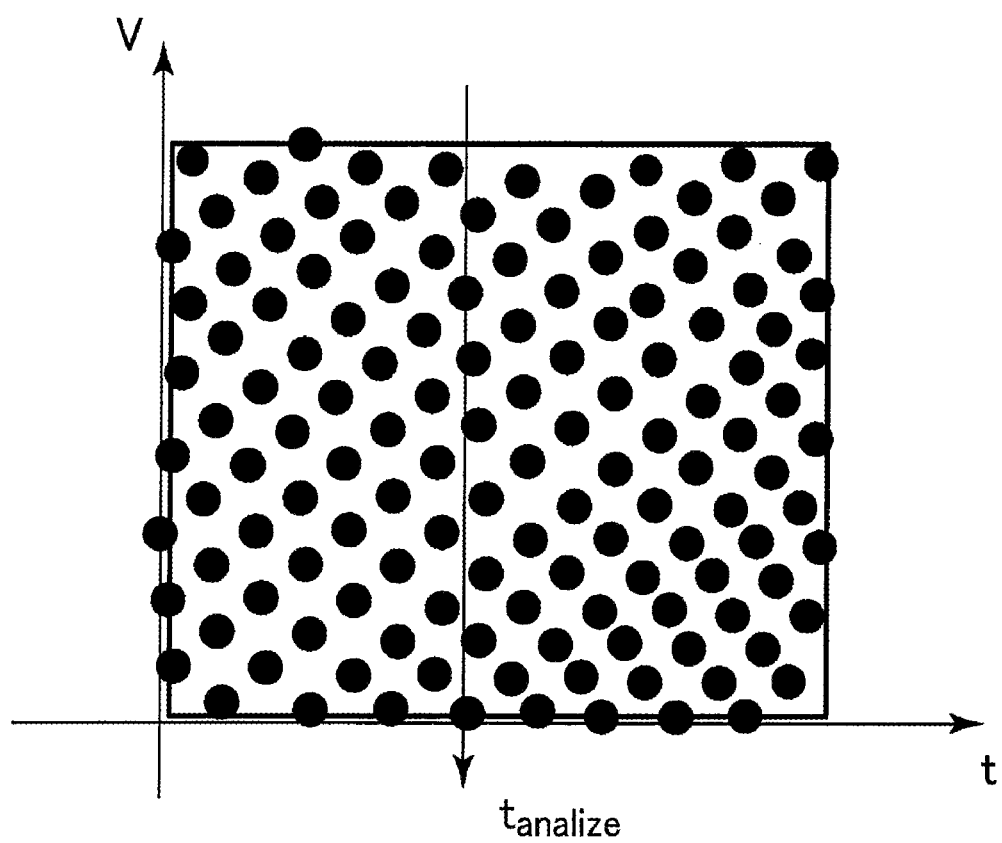
FIG. 14 explains analysis of data in a t-V area for one cycle of an electromagnetic wave pulse.

If data that fills the t-V area for one pulse cycle can be acquired, it is analyzed by dividing it by time as shown in FIG. 14. Generally, the measurement point does not necessarily exist on the time axis $t_{analize}$ is to be analyzed. In that case, it may be corrected to a value on the axis $t_{analize}$ analyzed by using linear interpolation or spline interpolation.

As described above, in the present embodiment, the frequency $f_{probe}$ of the probe voltage is deviated from the frequency $f_{pulse}$ of the electromagnetic wave pulse so that the data of the number of current values required for plasma measurement within the period of one pulse cycle, typically the current value I (V, t) which is a two-variable function, can be obtained within the required time. This makes it possible to perform time-resolved measurement without using an AC voltage having a frequency 20 to 100 times higher than the electromagnetic wave pulse frequency, as in the case of simply performing general time-resolved measurement. Accordingly, it is possible to measure the state of pulsed plasma using process gas in real-time relatively easily.

Further, in the plasma measurement method of the present embodiment, although the time required for the measurement per data is relatively long, since it is not necessary to change the voltage conditions for time-resolved measurement as in the case of using the Langmuir probe, the total measurement time can be shortened. Further, since the analyzer is built in the monitoring device of the power supply/monitoring portion 80, no additional equipment such as an oscilloscope is required.

Further, a sampling frequency $f_{sample}$ of the current can also be measured by "deviating" from $f_{pulse}$ in the same manner as $f_{probe}$, without making it extremely higher than $f_{pulse}$. Further, assuming that the upper limit of the allowable time for measurement is $T_{max}$, it is preferable that $T_{max}$ is 10 sec or less.

<Specific Conditions for Plasma Measurement>

Next, specific conditions for pulsed plasma measurement will be described.

Figure 15A:
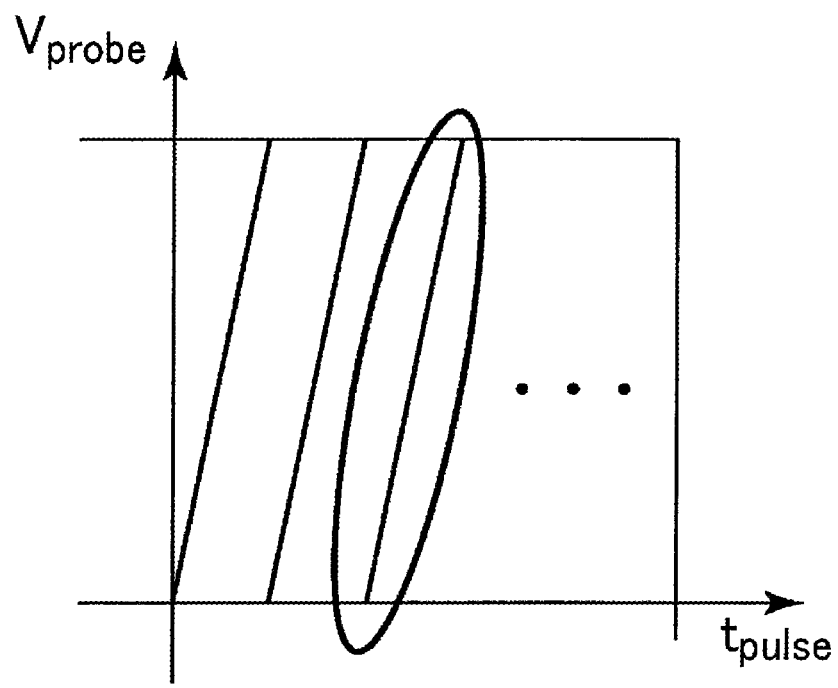
FIGS. 15A and 15B explain time required to draw one measurement line.
Figure 15B:
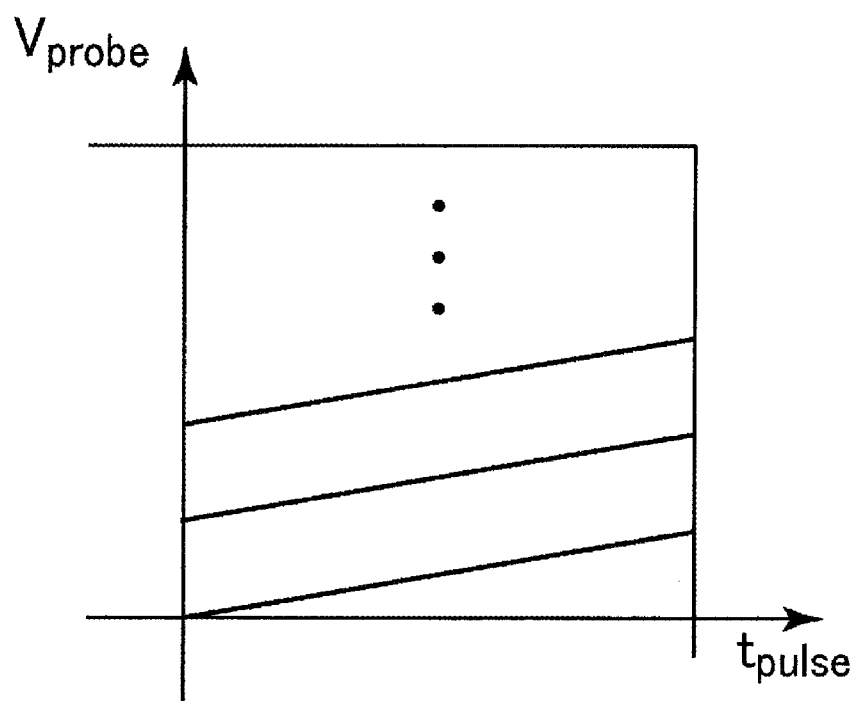

First, time required to draw one measurement line in the t-V graph shown in FIG. 10 will be examined. FIG. 15A shows a case of $f_{probe} > f_{pulse}$. Let $T_0$ be the time required to draw robe one of these measurement lines. In this case, from f=1/T, the conditions $T_{probe} < T_{pulse}$ and $T_0 = T_{probe}$ are satisfied. FIG. 15B shows the case of $f_{probe} < f_{pulse}$. In this case, the conditions $T_{probe} > T_{pulse}$ and $T_0 = T_{pulse}$ are satisfied.

These are summarized in the following equation.

$$T_0 = \min(T_{probe}, T_{pulse}) = \min(1/f_{probe}, 1/f_{pulse}) = 1/\max(f_{probe}, f_{pulse})$$

In the above equation, "min" indicates the minimum value between the two numerical values in parentheses, and "max" indicates the maximum value between the two numerical values in parentheses (the same applies hereinafter).

Figure 16A:
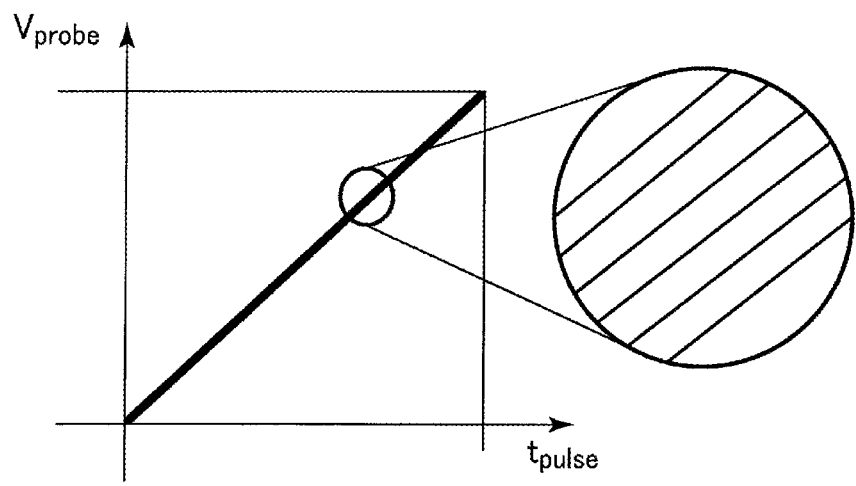
FIGS. 16A and 16B explain a difference in a measurement area between a case where measurement time is short and a case where measurement time is long, when $f_{probe}$ and $f_{pulse}$ are substantially equal but slightly different.
Figure 16B:
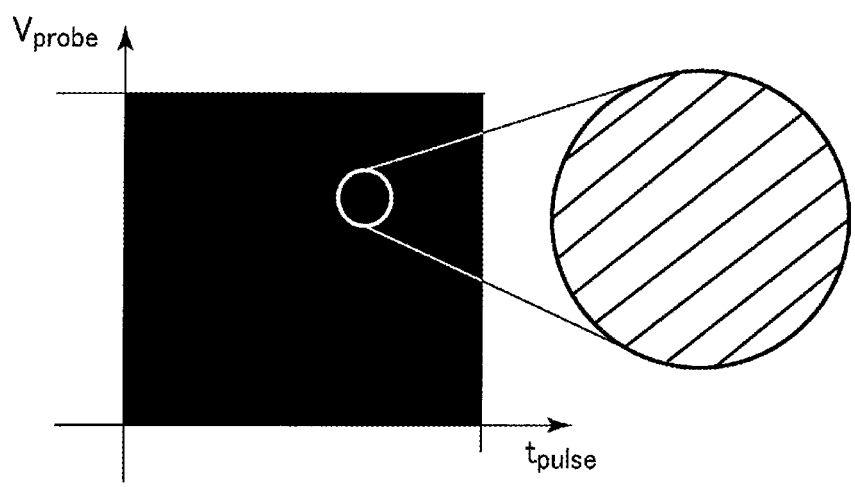

Next, the case where $f_{probe}$ and $f_{pulse}$ are substantially equal but slightly different is considered. In this case, in the measurement for a short time, the measurement area is apparently the area of one line on the t-V graph as shown in FIG. 16A. If such an area is expanded, several lines are connected. However, if the measurement is continued for a long time, the area on the t-V graph is eventually filled as shown in FIG. 16B.

In other words, when the upper limit of the allowable time for measurement is $T_{max}$ and $T_{max}$ is substantially equal to $T_0$ ($T_{max} \approx T_0$), since the measurement line can be drawn only in the area of one line on the t-V graph during $T_{max}$ as shown in FIG. 16A, the measurement becomes extremely inaccurate. On the other hand, in the case of $T_{max} >> T_0$, the measurement time is long, so that the area on the t-V graph can be filled as shown in FIG. 16B, which results in an extremely accurate measurement.

Figure 17:
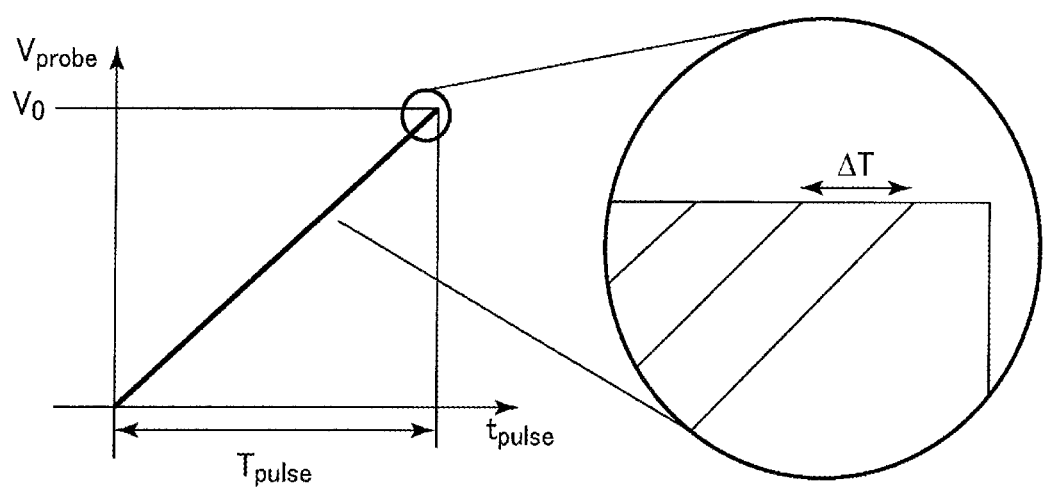
FIG. 17 explains $\Delta T$ that is an individual "deviation" in the case where $f_{probe}$ is slightly larger than $f_{pulse}$.

When $f_{probe}$ is slightly higher than $f_{pulse}$, the condition $T_0 = T_{probe}$ is satisfied, and if the "deviation" of each measurement line is ΔT as shown in FIG. 17, $\Delta T = T_{pulse} - T_{probe}$. In order to fill the entire area on the t-V graph, it is necessary to draw the number of lines shown by the following Eq. (1), and the time required therefor is expressed by the following Eq. (2).

$$\frac{T_{pulse}}{\Delta T} = \frac{T_{pulse}}{T_{pulse} - T_{probe}} \quad \text{Eq. (1)}$$

$$\frac{T_{pulse}}{\Delta T} T_0 = \frac{T_{pulse}}{\frac{f_{probe}}{f_{pulse}} - 1} \left( = \frac{1}{f_{probe} - f_{pulse}} \right) \quad \text{Eq. (2)}$$

Figure 18:
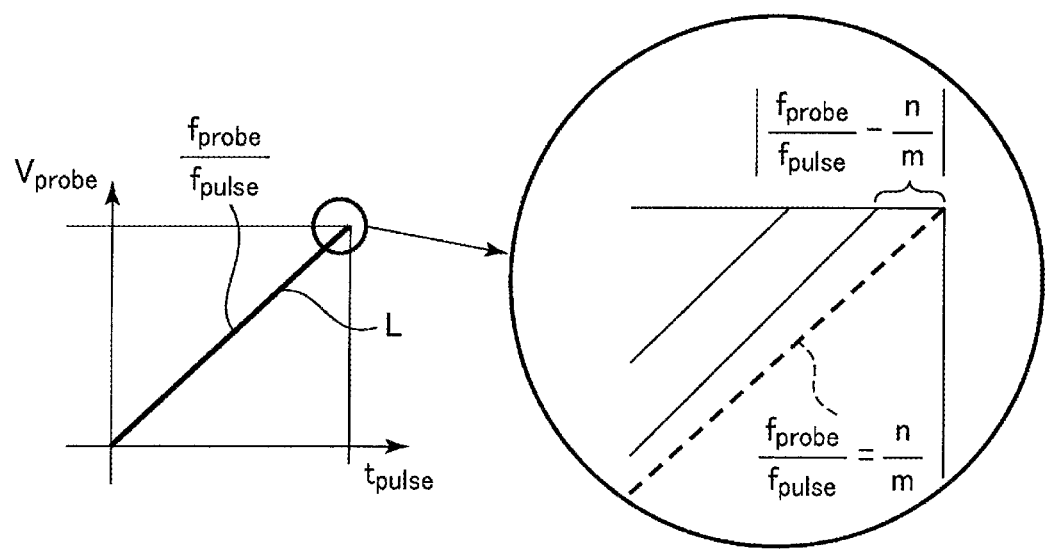
FIG. 18 explains Eq. (3) including integers m and n.

The measurement line L shown in FIG. 18 is a line indicating $f_{probe}/f_{pulse}$. The allowable amount of "deviation" of the measurement line is expressed by $T_0/T_{max}$. In this case, when the minimum positive integers m and n are taken so as to satisfy the following Eq. (3), this is an approximation with the required accuracy of $f_{probe}/f_{pulse}$. In other words, the Eq. (3) is an integer approximation of $f_{probe}/f_{pulse}$ with n/m, as shown in FIG. 18, the left side of the Eq. (3) indicates how much the line deviates from the line of $f_{probe}/f_{pulse} = n/m$ each time one line is drawn, and the Eq. (3) is an equation for finding m and n which are a set of minimum positive integers so that the deviation on the left side is within the allowable range.

$$\left| \frac{f_{probe}}{f_{pulse}} - \frac{n}{m} \right| < \frac{T_0}{T_{max}} \quad T_0 = \min(T_{pulse}, T_{probe}) \quad \text{Eq. (3)}$$

Next, the above Eq. (3) will be described in detail.

A virtual example in which conditions $T_0/T_{max} = 1/100$, $f_{probe}/f_{pulse} = 1001/1000$, and m=n=1 are satisfied is considered. In this case, the Eq. (3) is expressed by the following Eq. (4).

$$\left| \frac{f_{probe}}{f_{pulse}} - \frac{1}{1} \right| = \frac{1}{1000} \quad \text{Eq. (4)}$$

Figure 19:
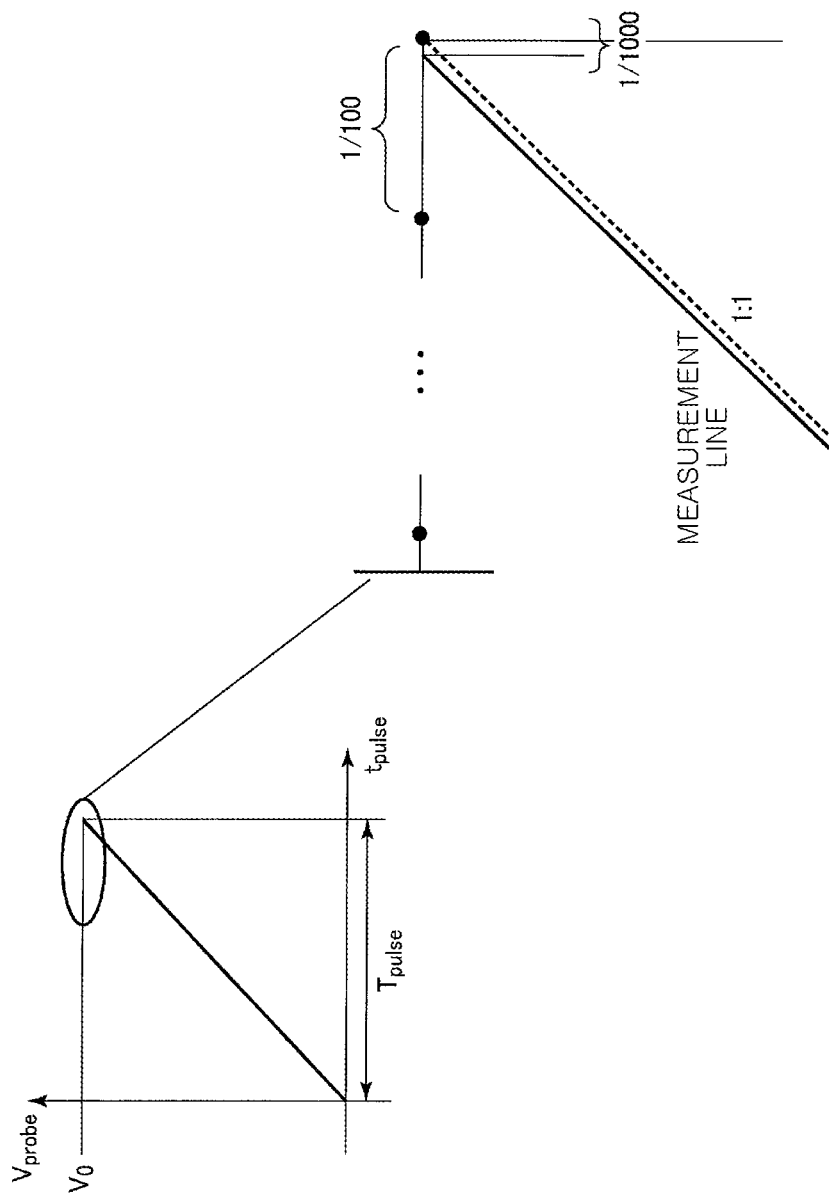
FIG. 19 explains, as a virtual example, measurement in the case where conditions $T_0/T_{max}=1/100$, $f_{probe}/f_{pulse}=1001/1000$, and m=n=1 are satisfied.

At this time, as shown in FIG. 19, the measurement line deviates from the 1:1 line only by 1/1000, and the amount of deviation at one time is 1/10 of $T_0/T_{max} = 1/100$, which is the minimum value of the allowable value. Therefore, the area of the t-V graph cannot be filled during $T_{max}$, and the measurement is extremely inaccurate with $f_{probe}/f_{pulse} = 1$ (rather, it is almost not established as a measurement).

Figure 20:
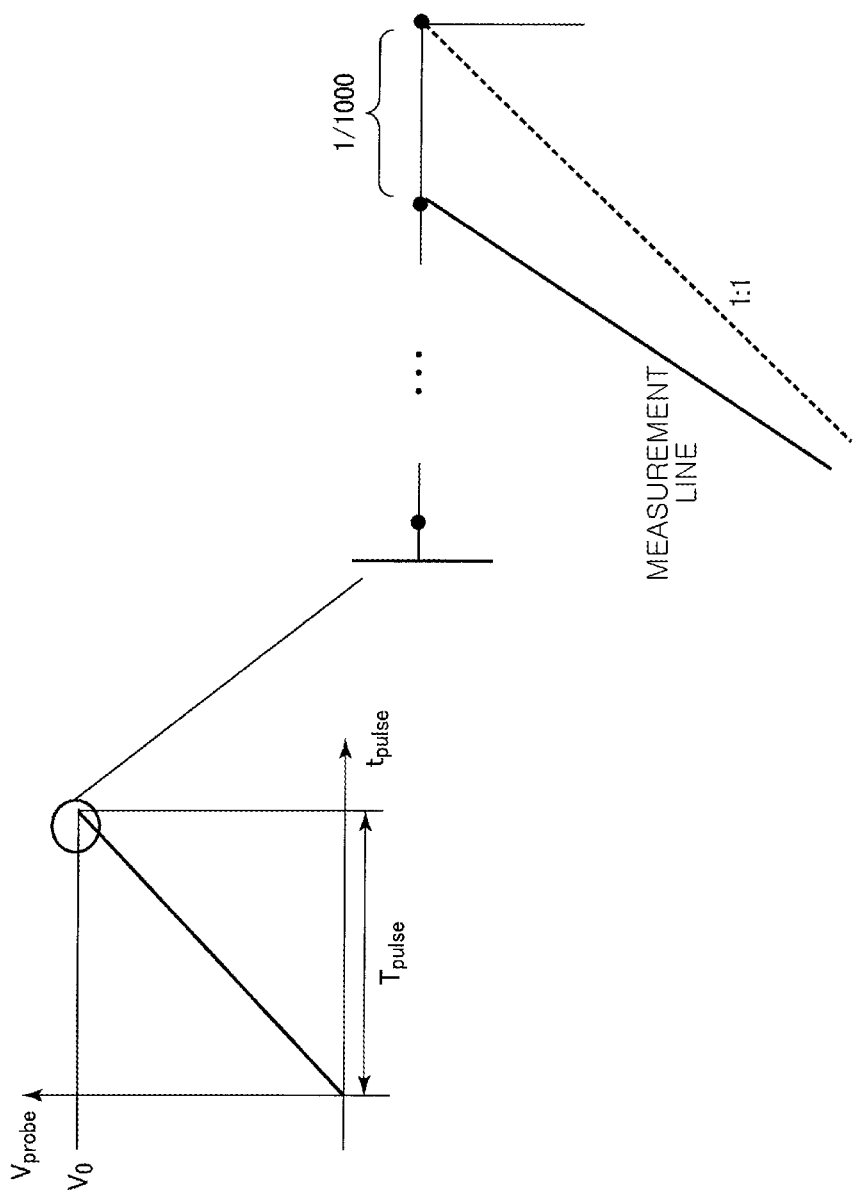
FIG. 20 explains, as a virtual example, measurement in the case where conditions $T_0/T^{max}=1/1000$, $f_{probe}/f_{pulse}=1001/1000$, and m=n=1 are satisfied.

Considering the case where $T_{max}$ is multiplied by 10 and $T_0/T_{max} = 1/1000$, as shown in FIG. 20, the measurement line deviates from the 1:1 line by 1/1000. Since, however, $T_{max}$ is large and the $T_0/T_{max}$ interval and the interval on the left side of Eq. (4) are substantially the same, it is possible to wait for the deviation of the measurement line to fill the entire area of the t-V graph, and an accurate measurement with $f_{probe}/f_{pulse} = 1001/1000$ can be established. In this case, however, since 1000 $T_0 = T_{max}$, the measurement time is barely within the limit.

Next, a trial calculation is performed by actually applying numbers to the above Eq. (3).

Here, $f_{probe} = 1000.1$ Hz and $f_{pulse} = 1000$ Hz. At this time, since $T_0 = 1/(\max(f_{probe}, f_{pulse}))$, $T_0 = 1/1000.1$ sec. For simplicity of explanation, it is approximated to $T_0 = 1/1000$ sec (the result is almost the same whether or not it is approximated).

At this time, $f_{probe}/f_{pulse} = 1000.1/1000 = 10001/10000 = 1.0001$, and when this is applied to the above Eq. (3), the following Eq. (5) is obtained.

$$\left| 1.0001 - \frac{n}{m} \right| < \frac{1}{1000 T_{max}} \quad \text{Eq. (5)}$$

Then, when $T_{max}$ is changed to 0.1 sec, 1 sec, and 10 sec, the above Eq. (5) becomes as follows.

- $T_{max} = 0.1 sec$ $$\left| 1.0001 - \frac{n}{m} \right| < 0.01$$

- $T_{max} = 1 sec$ $$\left| 1.0001 - \frac{n}{m} \right| < 0.001$$

- $T_{max} = 10 sec$ $$\left| 1.0001 - \frac{n}{m} \right| < 0.0001$$

When $T_{max}$ is 0.1 sec and 1 sec, the equation is established when n=m=1, and the accurate measurement cannot be performed. On the other hand, when $T_{max}$ is 10 sec, the equation is not established when n=m=1, and larger m and n are required. Assuming that n/m=5002/5001, the left side of the Eq. (5) becomes 0.00009996, which satisfies the equation. In other words, if $T_{max}$ increases to 10 sec, suddenly large m and n are required. As will be described later, since m and n define the number of measurement lines, when the values of m and n are increased in this way, accurate measurement is realized.

Figure 21:
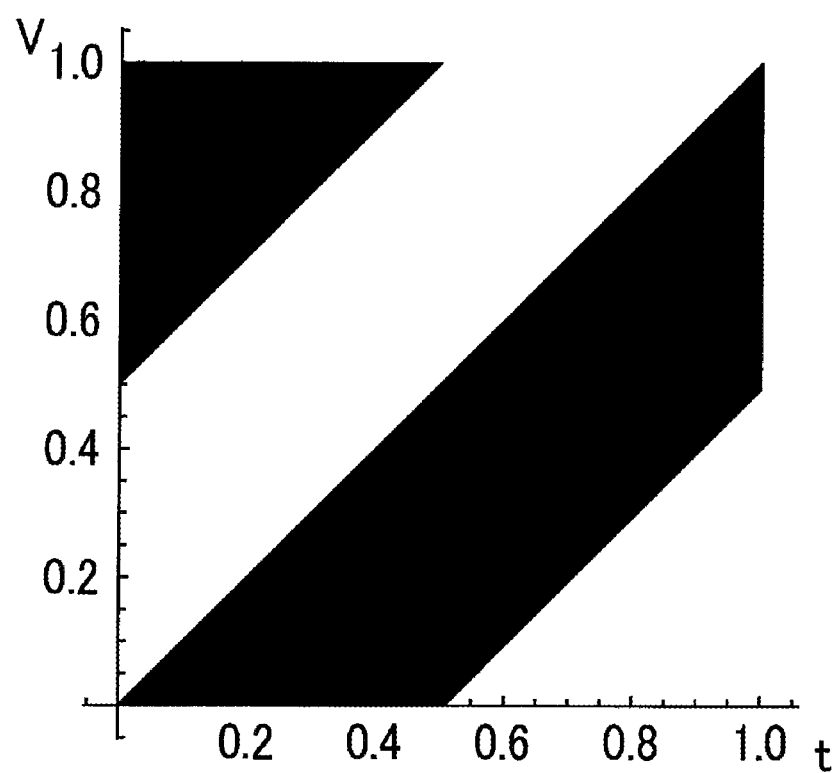
FIG. 21 explains data obtained in the case of n/m=5002/5001 derived by using Eq. (3) with $f_{probe}/f_{pulse}=1000.1/1000=10001/10000=1.0001$ and $T_{max}$ as 10 sec.

However, since $f_{probe}/f_{pulse}=10001/10000$, it is required to satisfy a condition $n/m=10001/10000$ to completely fill the area of the t-V graph, when $n/m=5002/5001$, as shown in FIG. 21, only half of the area of the t-V graph can be filled.

This is because the left side of the Eq. (3), which is the basis of the Eq. (5), is set as an absolute value. In other words, if the absolute value of the Eq. (5) is simply removed, the result is as follows.

$$-0.0001<1.0001-(n/m)<0.0001$$

$$1<n/m<1.0001+0.0001=1.0002$$

In other words, the last digit of the maximum value is doubled. In this equation, not 10001/10000 which is close to 1.0001 but 5002/5001 which is close to 1.0002 is the smallest positive integers m and n that satisfy the Eq. (5).

To avoid this, when the above Eq. (3) is divided into the case of $f_{pulse}<f_{probe}$ and the case of $f_{pulse}>f_{probe}$, the following Eq. (6) is obtained. The two equations for each case can be combined into one equation as shown in the following Eq. (7).

$$\left. \begin{array}{l} \cdot \text{When } f_{pulse} < f_{probe} \\ 0 \leq \dfrac{f_{probe}}{f_{pulse}} - \dfrac{n}{m} < \dfrac{1}{f_{probe}T_{max}} \\ \cdot \text{When } f_{pulse} \geq f_{probe} \\ 0 \leq \dfrac{f_{pulse}}{f_{probe}} - \dfrac{n}{m} < \dfrac{1}{f_{pulse}T_{max}} \end{array} \right\} \quad \text{Eq. (6)}$$

$$0 \leq \frac{\max(f_{probe}, f_{pulse})}{\min(f_{probe}, f_{pulse})} - \frac{n}{m} \leq \frac{1}{\max(f_{probe}, f_{pulse})T_{max}} \quad \text{Eq. (7)}$$

Next, a trial calculation is performed using the above Eq. (7). Here, as in the trial calculation of the above Eq. (3), $f_{probe}=1000.1$ Hz, $f_{pulse}=1000$ Hz, and $T_0=1/1000$ sec.

At this time, $f_{probe}/f_{pulse}=1000.1/1000=10001/10000=1.0001$, and when this is applied to the above Eq. (7), the following Eq. (8) is obtained.

$$0 \leq 1.0001 - \frac{n}{m} < \frac{1}{1000T_{max}} \quad \text{Eq. (8)}$$

When $T_{max}$ 10 sec, $1.001-(n/m)<0.0001$.

In this case, when $n=m=1$, the equation is not established, and larger n and m are required. In this case, when $n/m=5002/5001$, $1.0001-(n/m)=-0.00009996$, which is negative, and thus the above Eq. (8) is not satisfied. Therefore, it is necessary to further increase m and n. When m and n are increased until $n/m=10001/10000$, $1.0001-(n/m)=1.0001-(10001/10000)=0$, and the above Eq. (8) is satisfied. In this manner, the expected m and n can be obtained by using the above Eq. (8). In other words, the above Eq. (8) is one of the suitable conditions for the measurement of the pulsed plasma.

In the above description, the case where the $f_{probe}$ and the $f_{pulse}$ are close to each other has been described as an example in order to clarify the boundary, but even when $f_{probe}$ and $f_{pulse}$ are not close to each other, m and n satisfying the above Eq. (8) can be obtained in the same manner.

Figure 22:
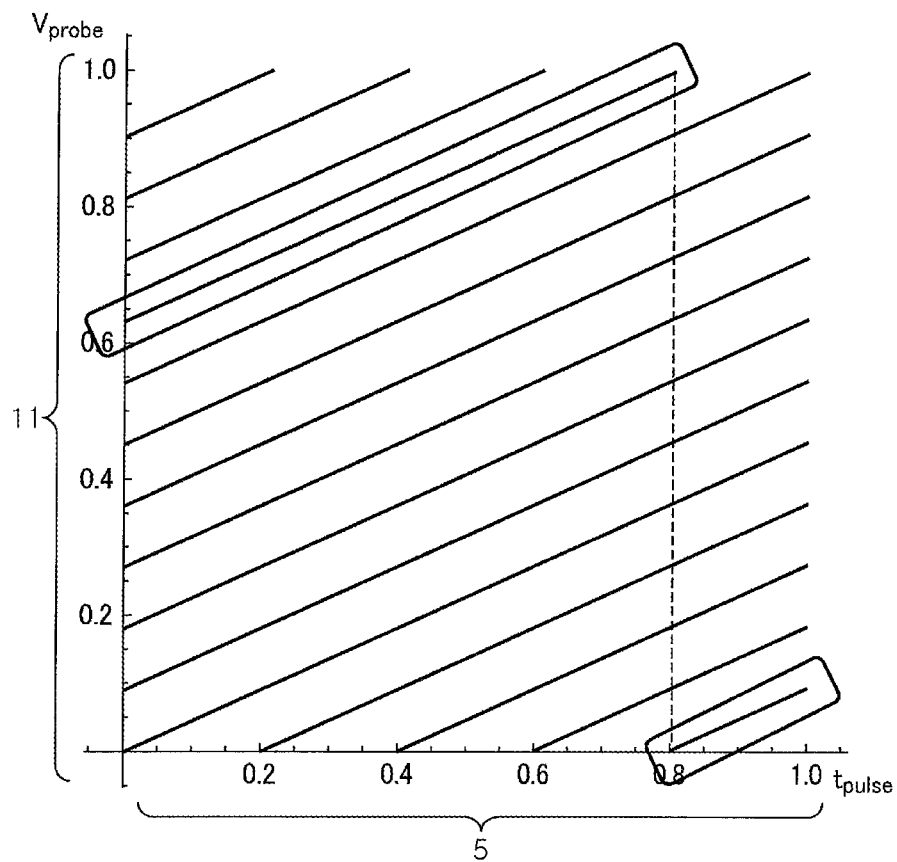
FIG. 22 shows measurement lines in the t-V area in the case where conditions n=11 and m=5 are satisfied.

As illustrated in FIG. 22, m and n described above appear as the number of points where a plurality of measurement lines intersect the t-line and the V-line of the t-V graph, respectively, and define the number of measurement lines. FIG. 22 is an example in which m=5 and n=11. The line surrounded by the frame in FIG. 22 is divided into two, but if the line from the left end to the right end is counted as one, the total number of lines is 11. In other words, in this example, the number of measurement lines N is max(n, m). This corresponds to $T_0=1/\max(f_{probe}, f_{pulse})$ and a higher frequency being used, as described above. In this case, the measurement time until the t-V area is filled is $NT_0=11T_{pulse}$.

When m and n are small, the number of measurement lines is small and the measurement accuracy is lowered. When the number of measurement lines is 10 or more, sufficient measurement accuracy can be ensured. Therefore, the following Eq. (9) can be mentioned as a suitable measurement accuracy requirement.

$$\max(m,n) \geq 10 \quad \text{Eq. (9)}$$

Further, the measurement time until the t-V area is filled is expressed by $NT_0$ as described above. It is required that $NT_0$ is smaller than $T_{max}$. In other words, since $N=\max(n, m)$ and $T_0=1/\max(f_{probe}, f_{pulse})$, the following Eq. (10) can be mentioned as a requirement for the measurement time. This equation shows that the measurement time cannot be satisfied if m and n are excessively large.

$$\frac{\max(m, n)}{\max(f_{probe}, f_{pulse})} < T_{max} \quad \text{Eq. (10)}$$

As described above, by satisfying the above Eqs. (8), (9), and (10), the optimum m and n can be obtained, and the data required for plasma measurement within the period of one pulse cycle of the pulsed plasma can be more reliably obtained within the required time.

<Signal Processing>

The signal from the plasma side obtained when an AC voltage is applied to the pulsed plasma using the probe device 70 is sent to the monitoring device. Then, the current value data, typically the current value I (V, t) which is a two-variable function, is measured by the built-in analyzer. The measured data is transmitted to and analyzed by the controller 8 to measure the state of pulsed plasma. The data analysis at this time is performed by performing Fourier transformation (FFT) on the current value.

In plasma, current flows exponentially with respect to a given voltage. The detected current value includes a fundamental wave component having a fundamental frequency and a harmonic component such as a first harmonic having a wavelength twice that of the fundamental wave, a second harmonic having a wavelength three times higher than that of the fundamental wave, or the like. Therefore, the electron density of the plasma and the electron temperature of the plasma are calculated by using the peaks of the amplitudes of the fundamental wave and the harmonics by FFT. In this case, the electron density and the electron temperature can be calculated by using the formula described in Japanese Laid-open Patent Publication No. 2019-46787.

As described in Japanese Laid-open Patent Publication No. 2019-46787, the measurement results of electrical characteristics such as the electron density and the electron temperature of the plasma when an AC probe (probe device 70) is used are equivalent to those of a Langmuir probe which is a DC probe.

OTHER APPLICATIONS

Although the embodiments have been described above, the embodiments of the present disclosure should be considered to be exemplary in all respects and not restrictive. The above-described embodiments may be omitted, replaced, or modified in various forms without departing from the scope of the appended claims and the gist thereof.

For example, in the above embodiment, as a plasma processing apparatus, an apparatus that performs plasma processing by surface wave plasma generated by radiating electromagnetic waves such as microwaves into the processing container from the plurality of electromagnetic wave introducing portions has been exemplified, but the present disclosure is not limited thereto. The electromagnetic wave introducing portion may be one. Further, the plasma processing apparatus is not limited to one that radiates electromagnetic waves to generate plasma, and may be a plasma processing apparatus using various other plasmas such as capacitively coupled plasma (CCP), inductively coupled plasma (ICP), magnetic resonance (ECR) plasma.

Further, in the above-described embodiments, the case where a semiconductor wafer is used as the substrate has been described, but the substrate is not limited to the semiconductor wafer, and may be another substrate such as a flat panel display (FPD) substrate typified by a liquid crystal display (LCD) substrate or a ceramic substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma measurement method for measuring a plasma state using a probe device in the case of performing plasma processing on a substrate by introducing process gas into a processing container accommodating the substrate and by producing pulsed plasma using an electromagnetic wave pulse, wherein the electromagnetic wave pulse is obtained by processing an electromagnetic wave generated from an electromagnetic wave oscillator using a pulsing device, the method comprising:

Applying an AC voltage to the pulsed plasma using the probe device;

transmitting a signal from the pulsed plasma based on the AC voltage using the probe device and measuring data including a current value; and obtaining a state of the pulsed plasma by analyzing the measured data;

wherein a frequency of the AC voltage is deviated from a frequency of the electromagnetic wave pulse so that the number of data required for the measurement of the pulsed plasma within one cycle of the electromagnetic wave pulse is obtained within allowable time, wherein when the frequency of the AC voltage is $f_{probe}$ and the frequency of the electromagnetic wave pulse is $f_{pulse}$, the conditions shown in the following Eqs. (1), (2), and (3) are satisfied:

$$0 \le \frac{\max(f_{probe}, f_{pulse})}{\min(f_{probe}, f_{pulse})} - \frac{n}{m} \le \frac{1}{\max(f_{probe}, f_{pulse})T_{max}} \quad \text{Eq. (1)}$$

$$\max(m, n) \ge 10 \quad \text{Eq. (2)}$$

-continued $$\frac{\max(m, n)}{\max(f_{probe}, f_{pulse})} < T_{max}, \quad \text{Eq. (3)}$$

wherein m and n represent a set of minimum positive integers satisfying the Eq. (1), and $T_{max}$ represents an upper limit of the allowable time for measuring the data.

2. The plasma measurement method of claim 1, wherein the AC voltage is continuously applied for a period of a plurality of electromagnetic wave pulses, and data of different points of the plurality of electromagnetic wave pulses are superimposed, so that the number of data within one cycle of the electromagnetic wave pulse is obtained.

3. The plasma measurement method of claim 1, wherein $T_{max}$ is 10 sec or less.

4. The plasma measurement method of claim 1, wherein the data including the current value is a current value as a two-variable function with voltage and time as variables.

5. The plasma measurement method of claim 1, wherein the frequency of the AC voltage is within a range of 500 Hz to 100 kHz.

6. The plasma measurement method of claim 1, wherein the frequency of the electromagnetic wave pulse is within a range of 500 Hz to 100 kHz.

7. The plasma measurement method of claim 5, wherein the frequency of the AC voltage is less than 10 times the frequency of the electromagnetic wave pulse.

8. The plasma measurement method of claim 1, wherein a sampling frequency for analyzing the data is deviated from the frequency of the electromagnetic wave pulse.

9. The plasma measurement method of claim 1, wherein the data is divided by time and analyzed, and, in that case, the data is corrected by using linear interpolation or spline interpolation so that the data exists on a time axis.

10. The plasma measurement method of claim 1, wherein an electron density and/or an electron temperature of the pulsed plasma is calculated by analyzing the data.

11. The plasma measurement method of claim 10, wherein the data is analyzed by performing Fourier transformation on the current value.

12. The plasma measurement method of claim 1, wherein the probe device has an insulating film on a surface in contact with the pulsed plasma.

13. A plasma measurement method for measuring a plasma state using a probe device in the case of performing plasma processing on a substrate by introducing process gas into a processing container accommodating the substrate and by producing pulsed plasma using an electromagnetic wave pulse, wherein the electromagnetic wave pulse is obtained by processing an electromagnetic wave generated from an electromagnetic wave oscillator using a pulsing device, the method comprising:

applying an AC voltage to the pulsed plasma using the probe device;

transmitting a signal from the pulsed plasma based on the AC voltage using the probe device and measuring data including a current value; and obtaining a state of the pulsed plasma by analyzing the measured data, wherein when a frequency of the AC voltage is $f_{probe}$ and a frequency of the electromagnetic wave pulse is $f_{pulse}$, the conditions shown in the following Eqs. (1), (2), and (3) are satisfied:

$$0 \leq \frac{\max(f_{probe}, f_{pulse})}{\min(f_{probe}, f_{pulse})} - \frac{n}{m} \leq \frac{1}{\max(f_{probe}, f_{pulse})T_{max}} \quad \text{Eq. (1)}$$

$$\max(m, n) \geq 10 \quad \text{Eq. (2)}$$

$$\frac{\max(m, n)}{\max(f_{probe}, f_{pulse})} < T_{max}, \quad \text{Eq. (3)}$$

wherein m and n represent a set of minimum positive integers satisfying the Eq. (1), and $T_{max}$ represents an upper limit of allowable time for measuring the data.

14. The plasma measurement method of claim 13, wherein $T_{max}$ is 10 sec or less.

15. The plasma measurement method of claim 13, wherein the data including the current value is a current value as a two-variable function with voltage and time as variables.

16. The plasma measurement method of claim 13, wherein the frequency of the AC voltage is within a range of 500 Hz to 100 kHz.

17. The plasma measurement method of claim 13, wherein the frequency of the electromagnetic wave pulse is within a range of 500 Hz to 100 kHz.

18. The plasma measurement method of claim 16, wherein the frequency of the AC voltage is less than 10 times the frequency of the electromagnetic wave pulse.

19. The plasma measurement method of claim 13, wherein a sampling frequency for analyzing the data is deviated from the frequency of the electromagnetic wave pulse.

* * * * *